United States Patent
Kang et al.

(10) Patent No.: US 6,974,069 B2
(45) Date of Patent: Dec. 13, 2005

(54) SOLDER BALL ATTACHING SYSTEM AND METHOD

(75) Inventors: Ju-il Kang, Cheonan (KR); Hee-Sang Yang, Cheonan (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 262 days.

(21) Appl. No.: 10/465,632

(22) Filed: Jun. 20, 2003

(65) Prior Publication Data

US 2003/0213832 A1    Nov. 20, 2003

Related U.S. Application Data

(62) Division of application No. 09/690,683, filed on Oct. 16, 2000, now Pat. No. 6,607,117.

(30) Foreign Application Priority Data

Oct. 15, 1999 (KR) .............................. 1999-44720

(51) Int. Cl.[7] .............................................. B23K 1/00
(52) U.S. Cl. .................... 228/103; 228/245; 228/205; 228/223
(58) Field of Search .......................... 228/6.2, 8, 9, 10, 228/33, 49.5, 103, 105, 245, 246, 205, 207, 228/223

(56) References Cited

U.S. PATENT DOCUMENTS

| | | | | |
|---|---|---|---|---|
| 4,908,126 A | * | 3/1990 | Willberg et al. | 209/573 |
| 5,632,438 A | * | 5/1997 | Hoffmeyer et al. | 228/180.5 |
| 5,848,705 A | * | 12/1998 | Gianpaolo et al. | 209/571 |
| 5,988,481 A | * | 11/1999 | Torihata et al. | 228/49.5 |
| 6,000,123 A | * | 12/1999 | Munezane et al. | 29/740 |
| 6,202,293 B1 | * | 3/2001 | Schaller et al. | 29/760 |
| 6,239,396 B1 | * | 5/2001 | Kang | 209/573 |
| 6,276,590 B1 | * | 8/2001 | Nakazato | 228/41 |
| 6,282,812 B1 | * | 9/2001 | Wee et al. | 34/464 |
| 6,315,185 B2 | * | 11/2001 | Kajii | 228/8 |

* cited by examiner

*Primary Examiner*—Johnson Johnathan
*Assistant Examiner*—Len Tran
(74) *Attorney, Agent, or Firm*—Harness, Dickey & Pierce, P.L.C.

(57) ABSTRACT

The disclosure is a plural process to perform a solder ball attaching process that corresponds to the final of a ball grid array package manufacturing process. For example, flux and solder balls are exactly attached on solder ball pads of base frames on which base tapes having a number of land pattern groups are adhered. In the above state, the base frames are inserted into an adjacent reflow device to make the solder balls be attached on the solder ball pads. After the flux of the solder ball pad, on which the solder ball is attached, is removed, the base frames are stored in containers. To perform the base frame storing process in a very small space, the transfer course of the base frames is in the form of loop.

2 Claims, 16 Drawing Sheets

SOLDER BALL ATTACHING SYSTEM AND METHOD

This is a Div. of 09/690,683, filed Oct. 16, 2000, now U.S. Pat. No. 6,607,117.

BACKGROUND OF THE INVENTION

1. Field of the Invention

The present invention relates to a solder ball attaching system and method for micro ball grid array packages, and more particularly, to a solder ball attaching system and method, which is capable of performing a solder ball attaching operation inside a single equipment successively.

2. Description of the Related Art

Recently, semiconductor products, which play a pivotal role for development of industry extending into electric, electronic, machine and aerospace industries, have been developed steadily in the technology.

To manufacture such semiconductor products, it must go through a semiconductor chip manufacturing process for manufacturing a semiconductor chip, a semiconductor chip packaging process for protecting the friable semiconductor chip and signal input-output between the semiconductor chip and an external equipment and a testing process.

Actually, the development of the semiconductor chip manufacturing technology and the improvement of performance of equipments of precision process for manufacturing the semiconductor chip have made the manufacture of a highly integrated semiconductor chip possible. Moreover, in the semiconductor chip package process, the development of the semiconductor packaging method and the improvement of efficiency of process equipment for manufacturing the semiconductor package have made the increase of efficiency of semiconductor products and the miniaturization of the semiconductor products.

Especially, a ball grid array package, which is mainly used for the highly integrated semiconductor products having lots of input/output terminals, has been disclosed. The ball grid array package is easier in treatment than a PGA(Pin Grid Array), in which signal input/output between the external device and the semiconductor chip is performed by I/O pins arranged in matrix type. Moreover, the ball grid array package, which is small in size, is what is called "chip scale package" that the whole size of the semiconductor product is about 120% of that of the semiconductor chip, and uses solder balls as input/output terminals in place of pins.

The ball grid array package, in state that the semiconductor chip is attached on a printed circuit board forming circuit pattern on both sides or on a non-circuit side of a flexible board having the other side forming the circuit pattern, connects a bonding pad of the circuit pattern and the semiconductor chip in various way, for example, a beam lead bonding, a wire bonding or others.

At this time, the circuit pattern is connected to a portion of a circuit pattern called as "solder ball pad" and performs electric signal input/output with the external device through the solder ball pad.

The semiconductor chip is wrapped with molding resin to protect it from external shock and force and a solder ball is attached on the solder ball pad by a solder ball attaching process for connection with the external device.

At this time, the solder ball attaching process is divided into a solder ball seating step that the solder ball is coated with a water-soluble flux and the solder ball is temporarily seated on the flux, a reflow step that the solder ball is melted and attached on the solder ball pad in a furnace of high temperature and a cleaning step for removing water-soluble d-solvent.

The solder ball seating step, the reflow step and the cleaning step are performed by a solder ball attaching equipment group. The solder ball attaching group includes a solder ball seating equipment for the solder ball seating step, a reflow equipment, a cleaning equipment and a loader equipment for storing the cleaned ball grid array package. The equipments are arranged in series and independently operated to perform their own step.

However, each of the unit equipments included in the typical solder ball attaching group are located closely with the related equipments, but as there is a long distance between the unit equipments, the area where the solder ball attaching equipment group occupies is very large.

Moreover, the solder ball seating equipment, the reflow equipment, the cleaning equipment and the loader equipment included in the solder ball attaching equipment group perform only their own process but not perform connection between the previous step and the next step. Therefore, the connection between the steps depends on an operator.

Furthermore, as the unit equipments of the solder ball attaching equipment group are arranged long and the operator must perform the connection between the steps, the operator's line of movement becomes long, thereby fatigue to the operator is accumulated, the period of time required to attach the solder ball on the ball grid array package becomes long, and the steps are not performed consecutively.

Additionally, even though the solder ball seating equipment is out of order and thereby the insertion of the ball grid array package into the reflow equipment and the cleaning equipment is delayed, as there is no connection between the steps, heating of the reflow equipment and cleaning solution feeding of the cleaning equipment are continued, thereby the equipments are easily deteriorated.

Moreover, additional loader equipment is required for storing the ball grid array package finishing the solder ball attachment. After starting the solder ball attaching process, as the operator must directly transfer all unloaded containers to the loader equipment, the automatization of the solder ball attaching process is difficult.

Furthermore, to transfer the ball grid array package from one step to another step, the ball grid array package must be discharged out from the unit equipment and inserted into the next equipment. If the ball grid array package is discharged out from the unit equipment and inserted into the next equipment, there may cause a bad process, for example, the solder ball to be attached drops down from the solder ball pad. Even though such problem is continued, investigation of the factors leading to the bad process is very difficult.

Additionally, as the unit equipments of the solder ball attaching equipment group perform independently their own step, it is difficult to control the whole solder ball attaching equipment group and thereby lots of time is required for the process and the bad process occurs frequently.

SUMMARY OF THE INVENTION

Accordingly, an object of the present invention is to minimize the installation area of a solder ball attaching equipment and to reduce an operator's the line of movement and the operator's fatigue by integrating equipments required for a solder ball attaching process in one equipment.

Another object of the present invention is to consecutively perform the solder ball attaching process and to achieve the automatization of process by connecting a previous step and the next step through the integrated equipments.

A further object of the present invention is to reduce the frequency number of the occurrences of the badness made during transfer by minimizing the transfer path of ball grid array packages being applied to the solder ball attaching process through the integrated equipments and not to occur the badness in process by separating the ball grid array packages having the badness from the ball grid array packages having good quality.

To achieve the above objects, the present invention provides a system for attaching solder balls, the system comprising: a base body; base frames unloader for unloading base frames from containers mounted on the base body to seat the solder balls on solder ball pads of the base frames; a solder ball seating device mounted on the base body, the solder ball seating device receiving the unloaded base frames from the base frame unloader, fixing in a designated position, coating with flux, seating the solder balls, sorting the base frames according to quality of solder ball seating and storing the base frames of good quality; a reflow device mounted on the base body, the reflow device loading the sorted and stored base frames and melting and cooling the solder balls; a cleaning device mounted on the base body, the cleaning device receiving the loaded base framed from the reflow device, cleaning the flux remaining on the solder ball pads with cleaning solution and drying the cleaning solution covered during cleaning step; and a base frame loader mounted on the base body, the base frame loader sorting the base frames according to attachment quality of solder ball attached on the solder ball pads of the base frames transferred from the cleaning device and storing the base frames of good quality.

To achieve the above objects, the base frame unloader includes: a container guider formed to extend from the upper portion of the base body to the inside empty space of the base body; a container elevator for lifting the containers stored in the inside empty space of the base body from the inside of the base body upward along the container guider; and a pusher discharging the base frames from the containers mounted on the container guider.

To achieve the above objects, the solder ball seating device includes: a composite unit for receiving, fixing and transferring the base frames unloaded from the base framed unloader; a flux coating unit for coating the solder ball pads of the base frames fixed on the composite unit with the flux; a solder ball seating unit for seating the solder balls on the solder ball pads coated with the flux by the flux coating unit; a transfer unit for transferring the flux coating unit and the solder ball seating unit to the solder ball pads fixed on the composite unit; a sorter unit receiving the base frames on which the flux and the solder balls are seated, the sorter unit sorting and storing the base frames according to quality of solder ball seating; and a waiting unit making the base frames of good quality, which are sorted and stored by the sorter unit, wait till the next step is performed.

To achieve the above objects, the reflow unit includes: a base frame feeder for loading the base frames, on which the solder balls are seated by the solder ball seating unit; a step transfer device for transferring the base frames; a chamber wrapping the step transfer device; a heating device mounted at the inner surface of an outlet of the chamber located oppositely to the step transfer device; and a cooling fan mounted at the inner surface of an inlet of the chamber separated from the heating device in a prescribed interval.

To achieve the above objects, the transfer device includes: a transfer screw extending from the outlet of the chamber to the cleaning device; a bushing for supporting both ends of the transfer screw; a motor mounted at one of the ends of the transfer screw to rotate the transfer screw; a transfer block screwed with the transfer screw, the transfer block moving along the transfer screw by the driving of the motor; and a pick-up module connected to the transfer block, the pick-up module transferring the base frame discharged to the outlet of the chamber.

To achieve the above objects, the cleaning device includes: a transfer device receiving the base frames discharged from the reflow device and transferring them; a cleaning chamber wrapping the transfer device; a cleaning solution feeding device mounted inside the cleaning chamber, the cleaning solution feeding device being mounted upper and lower portions of the transfer device; a drier device for drying the base frames cleaned by the cleaning solution feeding device; and an unloader for unloading the dried base frames.

Furthermore, to achieve the above objects, the present invention provides a method for attaching solder balls of a ball grid array package, the method comprising: a solder ball seating step of unloading base frames attaching base tapes on which solder ball pads are provided, coating the solder ball pads with flux, transferring identified solder balls on positions of the corresponding solder ball pads respectively, transferring the base frame after confirming the position of the solder balls on the solder ball pads, and transferring an empty container, from which all base frames are unloaded, in a designated position; a solder ball reflow step of melting and cooling the solder balls seated on the solder ball pads and transferring the base frames after receiving the base frames from the solder ball seating step; a cleaning step of removing the flux covered on the solder ball pads and transferring the base frames after receiving the base frames from the solder ball reflow step; and a base frame storing step of determining quality of the base frames received from the cleaning step, sorting the base frames according to the quality and storing the base frames in the empty container transferred to the designated position.

To achieve the above objects, the base frames, which finished the solder ball seating step, are transferred in the first direction, the empty container is transferred to the designated position along the second direction, the base frames, which finished the solder ball reflow step, are transferred in the third direction, and the base frames, which finished the cleaning step, are transferred in the fourth direction toward the empty container transferred to the designated position.

To achieve the above objects, the first, second, third and fourth directions are directed in such a manner that the transfer course of the base frames is in the form of a loop.

To achieve the above objects, preferably, the second direction is directed oppositely to the first direction.

BRIEF DESCRIPTION OF DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Now, preferred embodiments of a solder ball attaching system and a solder ball attaching method by the solder ball attaching system according to the present invention will be described hereinbelow with reference to the accompanying drawings.

Figure 1:
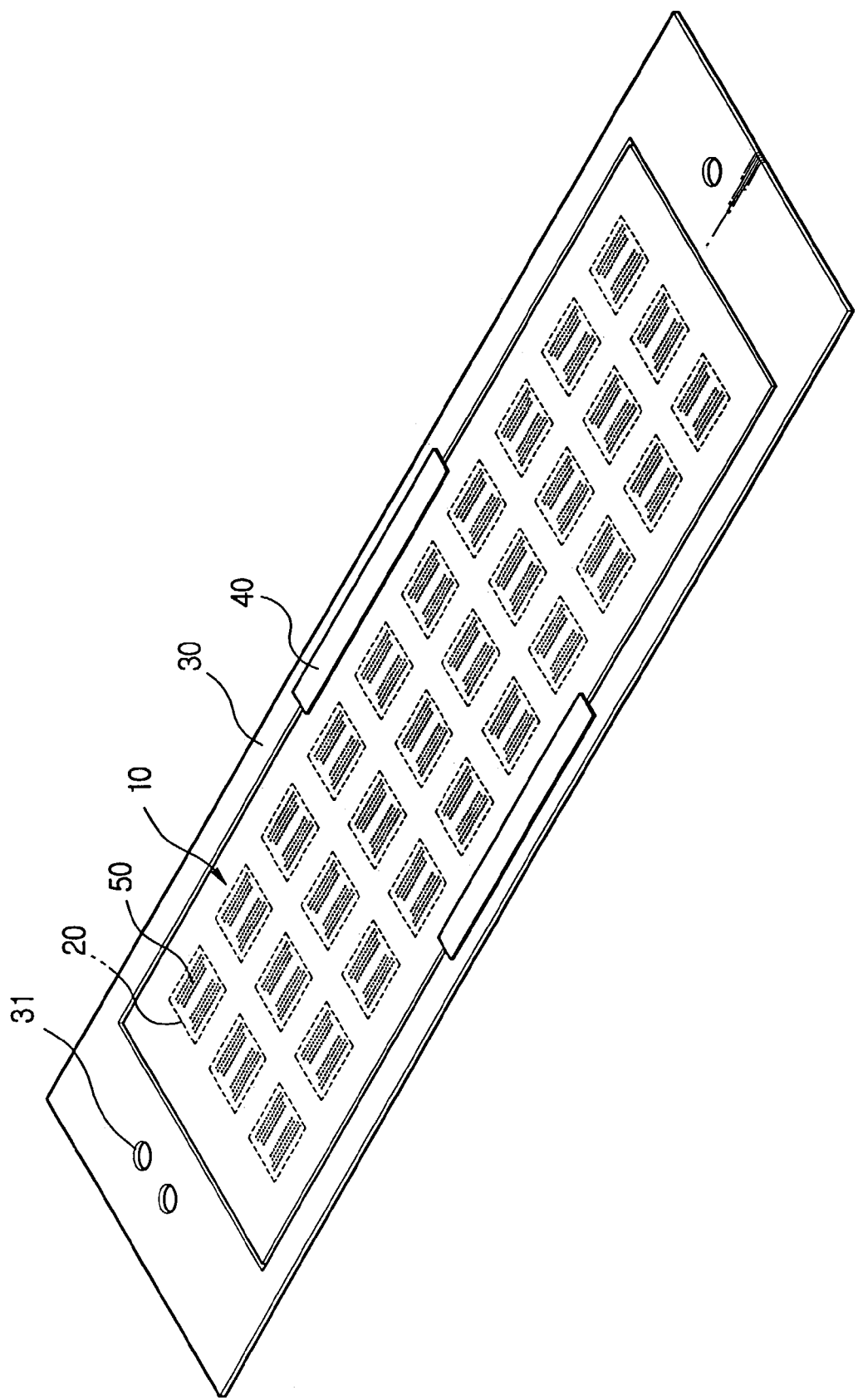
FIG. 1 is a perspective view of a base frame, on which a solder ball attaching process is performed by a solder ball attaching system according to the present invention.

First, referring to FIG. 1 or 2, the manufacturing process before attaching a solder ball on a ball grid array package will be described briefly.

The ball grid array package is formed on a base tape 10 of polyimide material, which is in the form of a long rectangle. The base tape 10 includes a number of land pattern groups 20 at one side thereof, each of which consists of solder ball pads 50 on which conductive patterns and solder balls are seated later by an etching. Later, each of the land pattern groups 20 becomes a ball grid array package.

The base tape 10 has an opening (not shown) called as an "open window" to expose a "beam lead" designating an end of the conductive pattern.

The base tape 10, which has the plural land pattern groups 20, is rolled and cut to form a device number, for example, the number of 3_10.

The cut base tape 10, which is flexible, is easily conformed by external power. Therefore, when a die attachment, a beam lead bonding and a solder ball attaching process of a semiconductor chip on the base tape 10 are performed, it is difficult to maintain its shape. To overcome the difficulty, the base tape 10 is adhered through the medium of an adhesive tape 40 on a base frame 30 of a square frame shape.

After that, the other side of the base tape 10 adhered to the base frame 30 has a solder ball pad 50. The side of the base tape 10, which has the solder ball pad 50, has a semiconductor chip (not shown) attached to expose a bonding pad through the open window. After a beam lead bonding is performed to the bonding pad and the beam lead of the semiconductor chip by a beam lead bonder, the semiconductor chip and the open window are encapsulated by a molding resin.

Figure 2A:
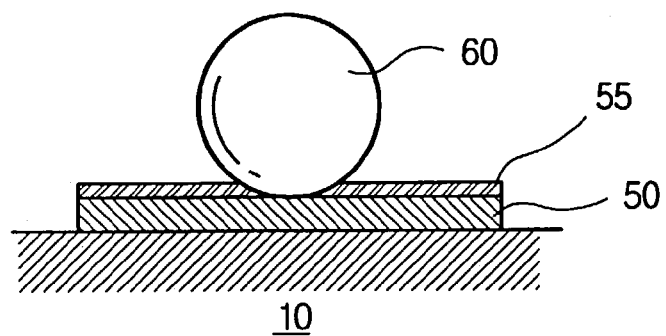
FIGS. 2a to 2c are views showing a process that a solder ball is attached on a solder ball pad by the solder ball attaching system according to the present invention.
Figure 2B:
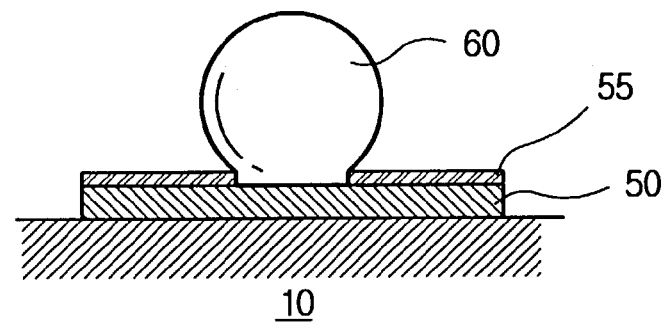
Figure 2C:
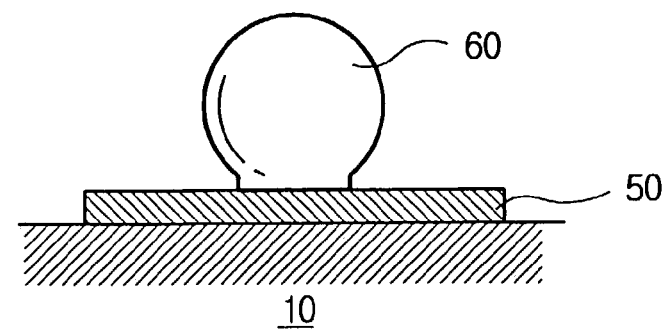

After that, the solder ball attaching process for seating the solder ball on the solder ball pad 50 disposed on the base frame 30 is performed. Referring to FIGS. 2a to 2c, the solder ball attaching process will be described hereinbelow.

As shown in FIG. 2a, after a water-soluble flux 55, which has a prescribed viscosity, is coated on the solder ball pad 50 provided on the base tape 10, a solder ball 60, has a diameter of several or several tens $\mu$m, is seated on the flux 55.

After that, as shown in FIG. 2b, the base tape 10 having the solder ball pad 50, on which the solder ball 60 is attached, passes a furnace of high temperature in such a manner that the solder ball 60 is melted on the solder ball pad 50 to be attached to the solder ball pad 50. As shown in FIG. 2c, the water-soluble flux 55 remaining on the solder ball pad 50, on which the solder ball 60 is attached, is removed by cleaning solution.

The solder ball attaching system performs all steps of the FIGS. 2a to 2c, described previously, on one base body.

Figure 3:
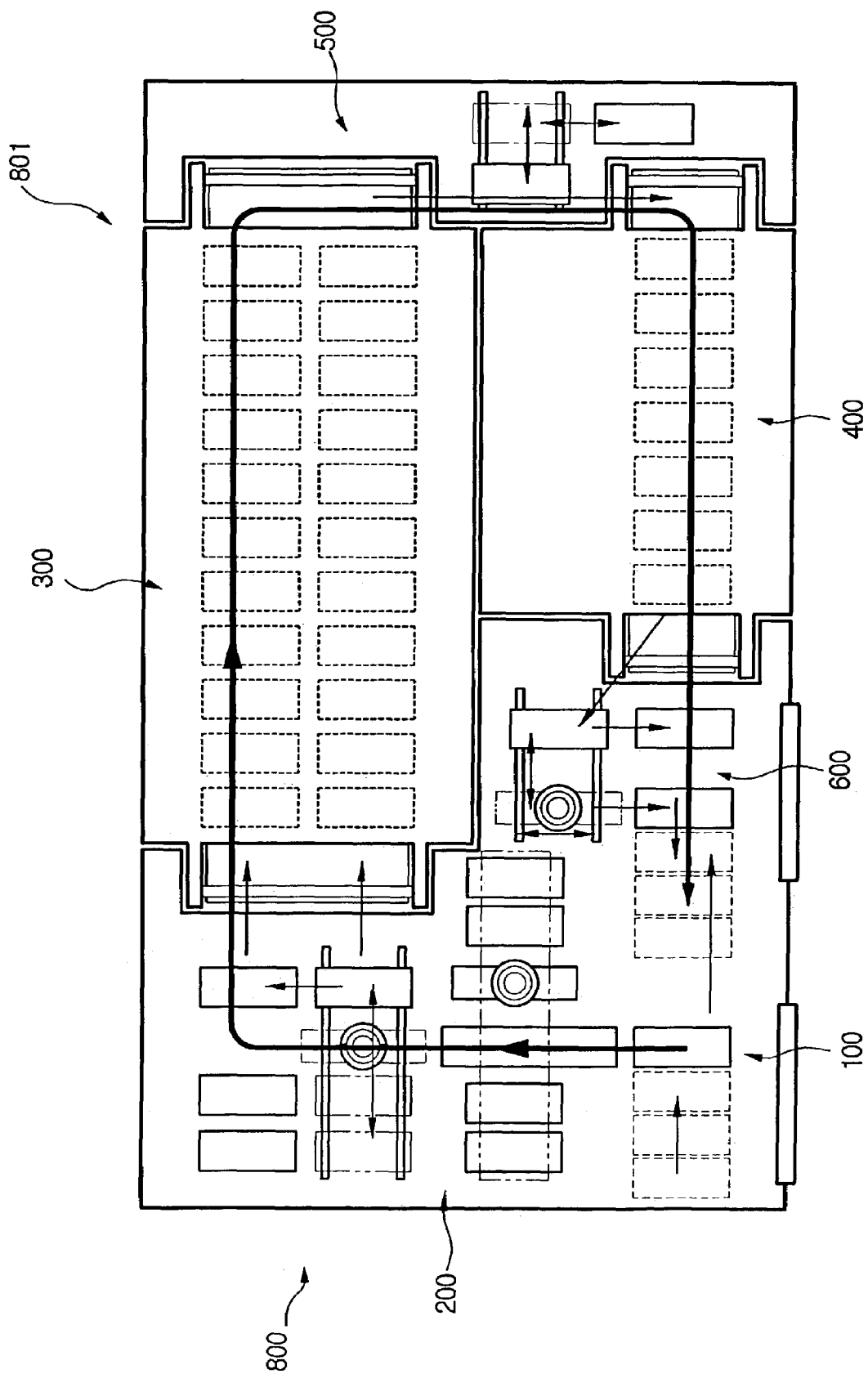
FIG. 3 is a block diagram of the whole structure of the solder ball attaching system according to the present invention.
Figure 4:
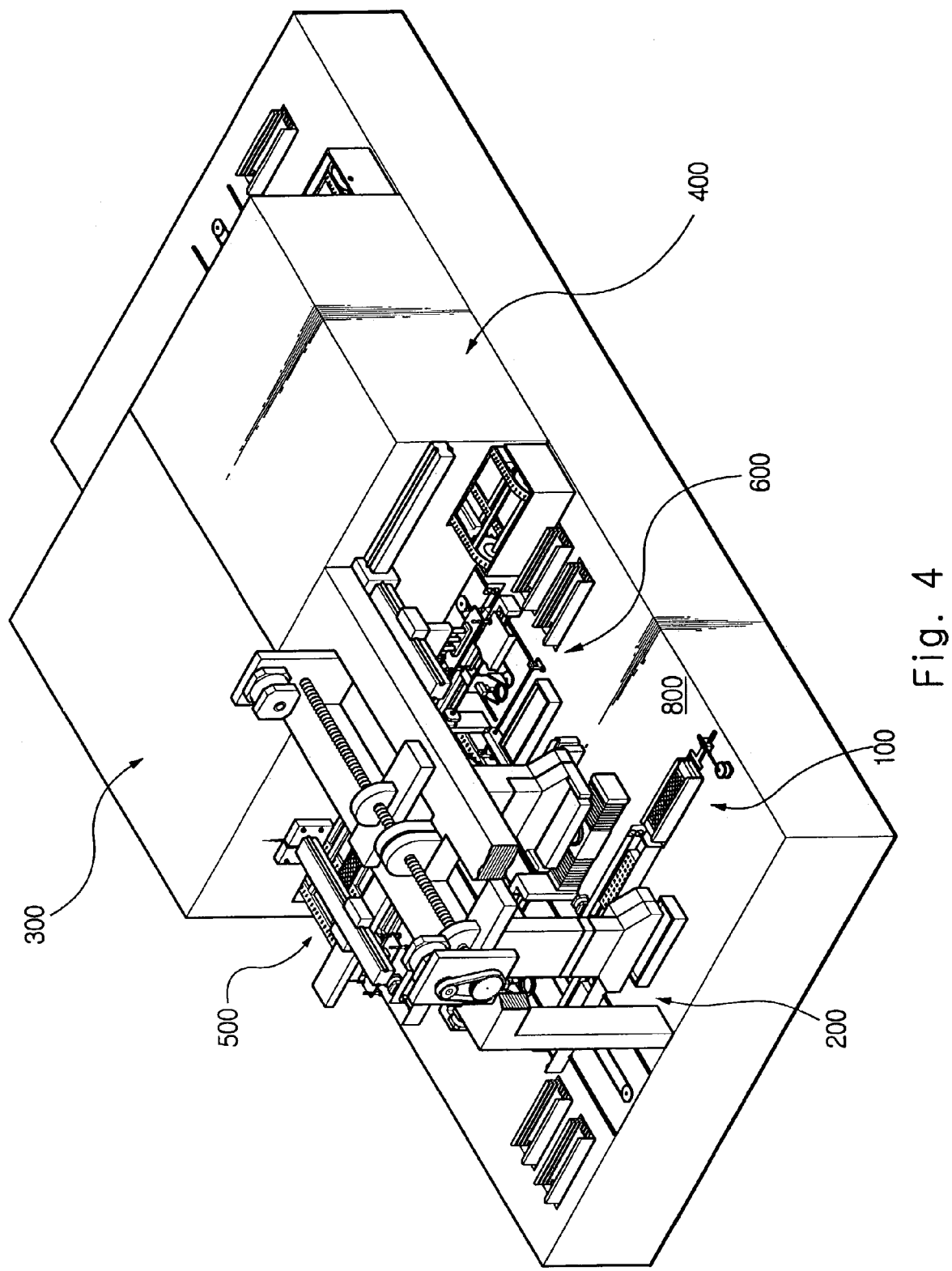
FIG. 4 is a perspective view of FIG. 3 reconstructed in three-dimension.

FIG. 3 or 4 illustrate the whole construction of the solder ball attaching system performing the solder ball attaching process as shown in FIGS. 2a to 2c.

Referring to FIG. 3 or 4, the solder ball attaching system 801 generally includes a flat base body 800 of a prescribed plane area, a base frame unloader device 100, a solder ball seating device 200, a reflow device 300, a cleaning device 400, a transfer device 500, a base frame loader device 600 and a central processing device (not shown) for generally controlling their operation.

The base frame unloader device 100, the solder ball seating device 200, the reflow device 300, the cleaning device 400, the transfer device 500 and the base frame loader device 600 are all arranged on the upper surface of the base body 800.

The components of the solder ball attaching system 801 are arranged in such a manner that the base frames 30 (see FIG. 1), on which the base tapes 10 (see FIG. 1) to attach the solder balls 60 later (see FIG. 2) are attached, perform the process in a prescribed course.

In more detail, the base frame 30 is unloaded from the base frame unloader device 100 and transferred in a clockwise direction according to a preferred embodiment. The base frame 30 passes through the solder ball seating device 200, the reflow device 300 and the cleaning device 400 in order to perform the solder ball attaching process. The base frame 30 unloaded from the cleaning device 400 is transferred along the course in the form of a loop as shown in FIG. 3 until inserted into the base frame loader device 600 adjacent to the base frame unloader device 100.

However, there is no necessity for transferring the base frame 30 in the course of the loop shape as previously described.

The arrangement of the components of the solder ball attaching system 801 according to the preferred embodiment to transfer the base frame 30 in the course of the loop shape has an advantage that allows the solder ball attaching system 801 to have the smallest plane area, i.e., to use the smallest space in the most efficiency. Moreover, the arrangement has another advantage that, as the base frame unloader device 100 performing the first step of the solder ball attaching process and the base frame loader device 600 performing the final step of the solder ball attaching process are arranged very near to each other, an empty container of the base frame unloader device 100 can be transferred to the base frame loader device 600, requiring the empty container, in a short time.

It will be appreciated that the transfer course of the base frame 30 according to the arrangement of the components of the solder ball attaching system 801 may not be in the form of the loop but be in the form of a character of "U".

Compared with the arrangement in the form of the loop described previously, the arrangement of the components of the solder ball attaching system 801, which may be varied in the form of a line, in the form of the "U" character or others, becomes long in the transferring length of the base frame 30 and requires much time in transferring the empty container from the base frame unloader device 100 to the base frame loader device 600. However, there is no influence on the connection between the components of the solder ball attaching system 801 and on automatization.

Such variable embodiments will be sufficiently supported by the detailed description to be described hereinafter.

In the present invention, preferably, the arrangement that the base frame 30 is transferred in the course of the loop shape is adopted as the arrangement of the components of the solder ball attaching system 801. Referring to the accompanied drawings, the detailed construction to embody it, functions and effects according to the construction will be described as follows.

Figure 5:
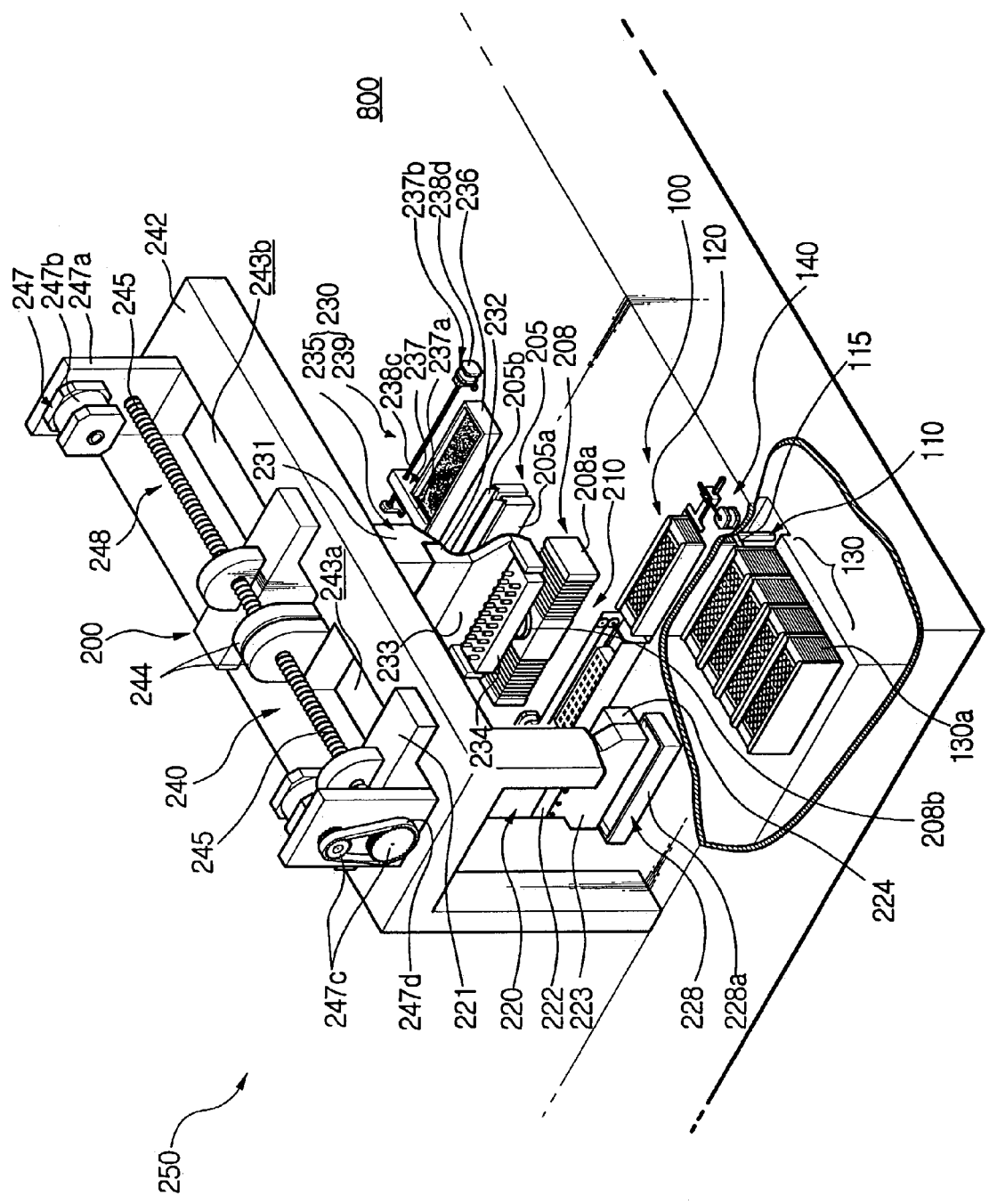
FIG. 5 is a perspective view, partially in section, of a base frame unloader and a part of a solder ball attaching device of the solder ball attaching system according to the present invention.
Figure 6:
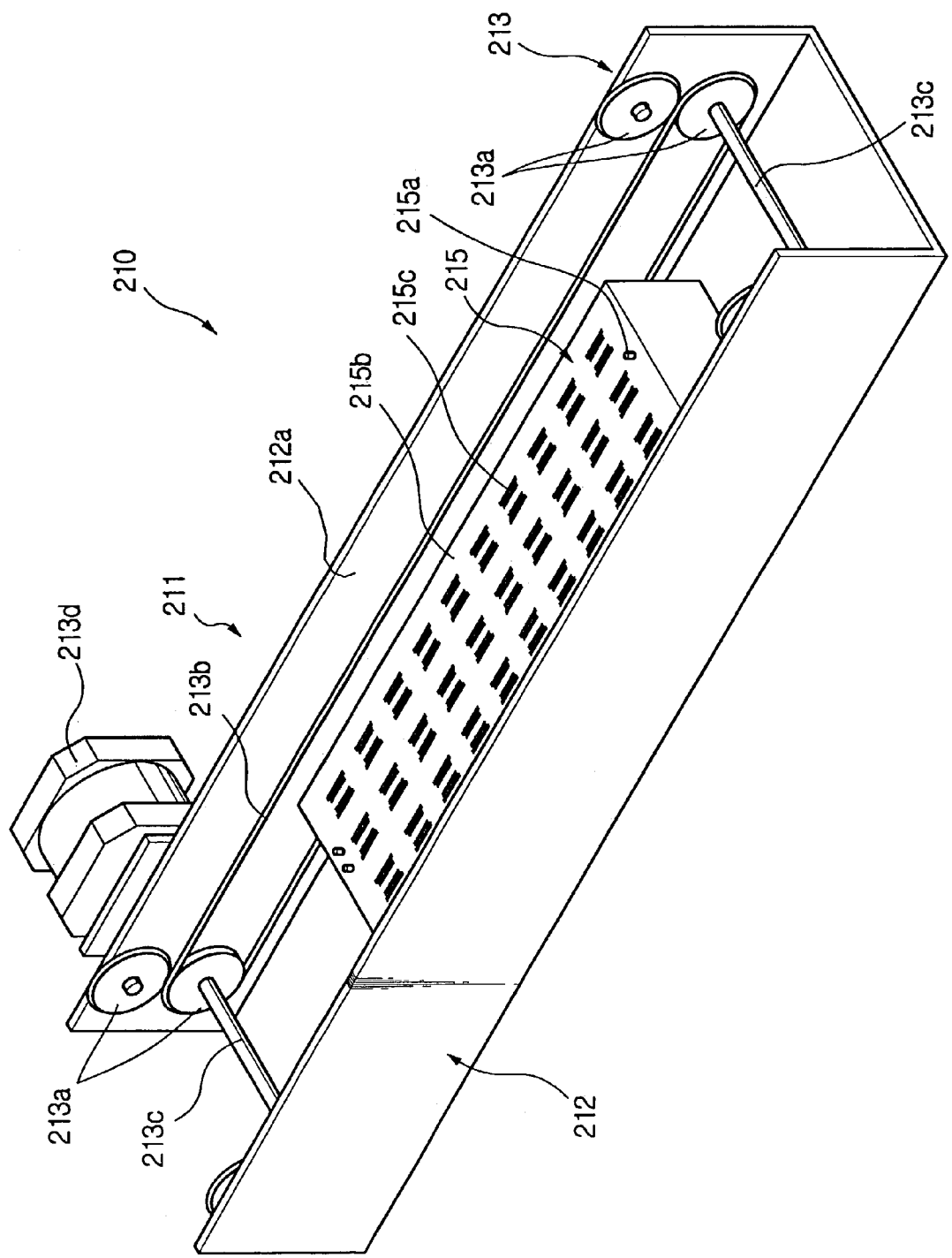
FIG. 6 is an enlarged perspective view of a composite unit of FIG. 5.

FIG. 5 or 6 illustrate the base frame unloader device 100 and the solder ball seating device 200.

FIG. 5 shows the location and the brief construction of the base frame unloader device 100 and the solder ball seating device 200 in the solder ball attaching system 801 and FIG. 6 shows a sorter device of the solder ball seating device 200.

Referring to FIG. 5, the base frame unloader device 100 will be described as follows.

The base frame unloader device 100 starting the solder ball attaching process is disposed between the inside empty space of the base body 800 and the upper portion of the base body 800 and includes a container elevator 110, a container guider 120 and a pusher 140.

In more detail, containers 130 storing the base frames 30, on which the base tapes 10 to attach the solder balls 60 are attached, are inserted into the inside empty space of the base body 800 in rows. The container elevator 110 for lifting the containers 130 to the upper surface of the base body 800 is disposed at an innermost container 130a of the containers 130.

A supporter 115 of the container elevator 110 has a pusher (not shown) mounted to push up the base frame 30 as much as the thickness of one base frame 30 received into the container 130.

The container guider 120 is disposed on the upper portion of the container elevator 110. The container guider 120 serves to exactly lift the container 130, lifted by the container elevator 110, into a designated position.

To perform the solder ball attaching process to the base frames 30 stored in the containers 130, the uppermost base frame 30 of the base frames 30 stored in the containers 130 lifted to the container guider 120 must be unloaded outside the container guider 120.

To unload the base frames 30 outside the container guider 120, the container guider 120 has a through hole (not shown) formed in the form of a slit for passing the base frames 30 and the pusher 140 disposed to forcibly unload the base frames 30 from the container guider 120.

The pusher 140 will be described hereinafter in more detail.

Th pusher 140 includes a pusher bar of a character of "T" shape, which is inserted into the through hole of the container guider 120 and directly contacted with a side of the base frame 30, a pusher bar block mounted at an end of the pusher bar, a guide rail connected to the pusher bar block for guiding the pusher bar block, a rotary shaft and a motor having a motor shaft connected to the other end of the rotary shaft for rotating the rotary shaft.

When rotating by the rotation of the motor shaft, the rotary shaft applies power to the pusher bar block. The pusher bar block is moved in the direction of the applied power along the guide rail depending on an amount of the applied power. The pusher bar connected to the pusher bar block is also moved by the movement of the pusher bar block and inserted into the through hole of the container guider to pressurize the base frame 30. The pressurized base frames 30 are pushed out of the container guider 120.

The base frame unloader device 100, which has the plural containers 130 inside the base body 800 and lifts only the required containers 130 on the upper portion of the base frame 30, secures a sufficient space on the upper surface of the base body 800 to make the arrangement of other components to be disposed on the upper surface of the base body 800 much easier.

Such base frames 30 unloaded from the inside to the outside of the containers 130 by the base frame unloader device 100 are transferred to the solder ball seating device 200. Referring to FIG. 5 or 6, the solder ball seating device 200 includes a solder ball seating unit 250, a sorter unit 270 and a process waiting unit 280.

Concretely, the base frames 30 unloaded from the base frame unloader device 100 are first loaded onto the solder ball seating unit 250, and after passing the sorter unit 270, only the base frames determined as a high-quality product are standing by in the process waiting unit 280 and then unloaded onto the reflow device 300 for the next step.

Each of the units will be described in more detail as follows.

The solder ball seating unit 250 includes a composite unit 210, a flux coating unit 220, a solder ball supply unit 230, a shared driving unit 240 for actuating the flux coating unit 220 and the solder ball supply unit 230, a solder ball cleaning unit 205 and a visual inspection unit 208.

The base frames 30 unloaded from the base frame unloader device 100 are loaded onto the composite unit 210.

Referring to FIG. 6, the composite unit 210, which receives the base frame 30 from the base frame unloader device 100, when the flux 55 is exactly coated on the solder ball pad 50 of the base frame 30 and the solder ball 60 is exactly seated on the coated solder ball pad 50, serves to fix the base frame 30 not to move and to transfer the base frame 30, on which the solder ball is seated, for the next step.

To embody it, the composite unit 210 has the construction for loading/unloading the base frame 30 and the construction for fixing the base frame 30.

It will be appreciated that there are various constructions to transfer the base frames 30. However, preferably, the present invention adopts the construction that the base frames 30 pass between a pair of rollers, which are rapidly rotated vis-a-vis to each other not to apply shock to the base frames 30 during loading/unloading the base frames 30, to transfer the base frames 30.

In more detail, the composite unit 210 includes a transfer unit 211 and a fixed unit 215.

The transfer unit 211 includes a support body 212 and a roller transfer unit 213 disposed at the support body 212 to transfer the base frame 30.

The support body 212 includes two support plates 212a separated from each other as wide as the width of the base frame 30 and a bottom surface connected to the lower ends of the support plates 212a to prevent the support plates 212a from falling down.

The roller transfer unit 213 is disposed at the inside of the support plates 212a of the support body 212.

The roller transfer unit 213 includes engaging rollers 213a rotating in facing to each other at both inner ends of each support plate 212a, a belt 213b connecting the engaging rollers 213a disposed at one end of the support plate 212a and the engaging rollers 213a disposed at the other end of the support plate 212a, a rotary shaft 213c connecting the turning center of the engaging rollers 213a facing to each other at any end of the support plates 212a and a motor 213d connected to the rotary shaft 213c.

The use of the roller transfer unit 213 as the transfer unit 211 is to transfer the base frames 30 very smooth and rapidly. The reason is that the solder balls 60, which are easily separated from the solder ball pads 50 even by a small shock, are seated on the solder ball pads 50 of the base frames 30 to be transferred by the composite unit 210.

The fixed unit 215 of the composite unit 210 is mounted at the bottom surface of the support body 212.

The fixed unit 215 includes a base frame adsorption pad 215b having at least two or more alignment keys 215a formed at the upper surface thereof and an up-down cylinder (not shown) for lifting the base frame adsorption pad 215b.

The base frame adsorption pad 215b is in the form of an empty hexahedron. The base frame adsorption pad 215b has an upper surface having a number of vacuum holes 215c and a lower surface connected to a vacuum device (not shown) generating vacuum pressure.

The at least two or more alignment keys 215b formed at the upper surface of the base frame adsorption pad 215b are coupled with alignment holes 31 formed in the base frame 30 to keep the base frame 30 located at a designated position of the upper surface of the base frame adsorption pad 215b and to fix the base frame 30 on the upper surface of the base frame adsorption pad 215b again by the vacuum pressure generated by the vacuum device.

When the base frame 30 is fixed to the composite unit 210, after the solder ball pad 50 is coated with the flux 55 and the seating of the solder ball 60 is ready, the solder balls 60 are seated on the base frame 30 by the flux coating unit 220 and the solder ball supply unit 230.

The flux coating unit 220 and the solder ball supply unit 230 are disposed at both sides of the composite unit 210 and transferred to the composite unit 210 by the shared driving unit 240.

The shared driving unit 240 transferring the flux coating unit 220 and the solder ball supply unit 230 includes a support frame 242 arranged in the direction across the upper portion of the composite unit 210 and a screw transfer unit 248 mounted on the support frame 242.

The support frame 242 is in the form that both ends of a rectangular parallelepiped plate are bent. The ends of the support frame 242 are fixed to the upper surface of the base body 800. The support frame 242 is higher than the composite unit 210.

The support frame 242 has two through holes 243a and 243b in the form of a long slit formed in the upper surface thereof and the through holes 243a and 243b have bushings 244 at both ends to face to each other.

At this time, the bushings 244 facing to each other have transfer screws 245 mounted in a rotatable manner respectively. A transfer screw driving device 247 is installed at one end of the transfer screws 245 to rotate the transfer screws 245.

The transfer screw driving device 247, in one embodiment, includes a driving device bracket 247a formed or mounted at both upper ends of the support frame 242, a driving motor 247b which is mounted on the external surface of the driving device bracket 247a and in which a motor shaft penetrates from the outside to the inside of the driving device bracket 247a a pulley 247c mounted at the motor shaft and the end of the transfer screw 245 and a power transmission belt 247d put on the pulley 247c to transmit driving power from the motor shaft to the transfer screws 245.

The flux coating unit 220 and the solder ball supply unit 230 are mounted under the shared driving unit 240 in such a manner that they are moved toward the upper portion of the composite unit by the transfer screws 245 and the transfer screw driving device 247, which is disposed at the transfer screw 245.

The flux coating unit 220 includes a support block 221, an up-down cylinder 222, a bracket 223, a flux coating block 224 and a flux supply tray unit 228.

First, the construction of each component of the flux coating unit 220 will be described hereinafter in more detail. The support block 221 has the shape and size to be inserted into the through hole 243a in the form of the slit formed in the upper surface of the support frame 242 of the shared driving unit 240. The up-down cylinder 222, which has a cylinder rod generating vertical displacement, is arranged at the lower end portion of the support block 221.

The bracket 223, which generates the displacement by the up-down cylinder 222, is disposed at an end of the cylinder rod of the up-down cylinder 222 and the flux coating block 224 is detachably mounted at an end of the bracket 223.

Like this, if the flux coating block 224 is detachably mounted in connection with the bracket 223, even though the base tapes, which has the solder ball pads 50 having different patterns, are provided, only the flux coating block identical with the changed pattern of the solder ball pad 50 is replaced with a new one without replacing the whole flux coating unit 220.

The detachable flux coating block 224 has a flux coating pin (not shown) disposed at the position of the lower portion thereof corresponding to that of the solder ball pad 50 of the base tape 10 attached on the base frame 30. After the flux coating pin (not shown) is covered with the flux, the up-down cylinder 222 is actuated to make the flux coating pin be contacted to the upper surface of the solder ball pad 50, so that the solder ball pad 50 is coated with the flux.

To make the flux coating pin of the flux coating block 224 be covered with the flux, the flux feed tray unit 228 is mounted on a path, on which the support block 221 moves, of the upper surface of the base body 800.

The flux feed tray unit 228 includes a flux tray 228a and a coating unit.

The flux tray 228a is in the form of a tray that has a flat bottom and is larger than the flux coating block 224. The bottom surface of the flux tray 228a is coated with the flux thin.

Like this, to coat the bottom surface of the flux tray 228a with the flux thin, the coating unit (not shown) is mounted at the flux tray 228a.

The coating unit includes a coating block reciprocating along the bottom surface of the flux tray 228a in contact with the bottom surface of the flux tray 228a, a flux feeder for supplying the flux between the coating block and the bottom surface of the flux tray, a transfer screw screwed with the bushing formed at a side of the coating block and a coating block transfer device having a motor connected to an end of the transfer screw.

It will be appreciated that the coating block transfer device may freely utilize various straight reciprocating motion devices for straight reciprocating motion of the coating block, besides the above screw transfer way. For example, it is possible that the coating block is slidingly connected to the guide rail and also connected to the cylinder rod of a hydraulic cylinder and the hydraulic cylinder is operated to perform the straight reciprocating motion of the coating block.

The flux coating unit 220 performs the straight reciprocating motion on the designated path by the shared driving unit 240 to make the flux be coated on the solder ball pad 50 of the base frame 30 fixed on the composite unit 210.

When the flux 55 is coated thin on the solder ball pad 50 of the base frame 30 by the flux coating unit 220, the solder ball 60 is temporarily seated on the upper surface of the solder ball pad 50, coated with the flux, by the solder ball feeding unit 230.

The solder ball feeding unit 230 includes a solder ball adsorption unit 235, which has a support block 231, an up-down cylinder 232, a bracket 233 and a solder ball adsorption block 234, and a solder ball feeding tray unit 239.

First, each of the components of the solder ball adsorption unit 235 will be described in more detail as follows.

The support block 231 has the shape and size to be inserted into the through hole 243b in the form of the slit formed in the upper surface of the support frame 242 of the shared driving unit 240. The support block 231 has the up-down cylinder 232 at a lower end portion. The up-down cylinder 232 has a cylinder rod, in which the vertical displacement occurs.

The bracket 233 is disposed at the cylinder rod of the up-down cylinder 232 and the detachable solder ball adsorption block 234 is disposed at the bracket 233.

As the above, when the solder ball adsorption block 234 is detachably mounted, if the base tapes having the solder ball pads 50, which have different pattern type like the flux coating block 224 of the flux coating unit 220 described previously, is provided, only the solder ball adsorption block is replaced without replacing the whole solder ball adsorption unit 235.

The solder ball adsorption block 234 being in the form of an empty hexahedron includes a solder ball storing hole (not shown) of a prescribed depth, which is formed in the lower surface thereof corresponding to the position of the solder ball pad 50 of the base frame 30 to receive the solder ball 60, and a vacuum hole (not shown) formed in the solder ball storing hole in communication with the inside of the solder ball adsorption block 234 to adsorb the solder ball 60 by vacuum pressure.

To embody it, a vacuum pressure generator is connected with the inside of the solder ball adsorption block 234 to make the inside of the solder ball adsorption block 234 be in vacuum pressure.

At this time, it is next to impossible that the solder balls 60 are stored one by one in the solder ball storing hole of the solder ball adsorption block 234. Therefore, in the present invention, a special way to receive the solder ball 60 in the solder ball storing hole exactly is used and it is obtained by the solder ball feeding tray unit 239.

The solder ball feeding tray unit 239 includes a solder ball tray 236 of a tray shape of a prescribed depth formed in such a manner that a large number of solder balls 60, which have the sizes of several or several tens μm, are stored therein and a solder ball flat unit 237.

The solder ball flat unit 237 includes a brush disposed inside the solder ball tray 236, a brush unit 238 having a brush transfer unit 237b to make the brush 237a straight reciprocate along the solder ball tray 236 and a vibration unit (not shown) disposed at a lower surface of the solder ball tray 276 to vibrate the brush unit 238 and the solder ball tray 276 horizontally.

The brush transfer unit 237b is very similar in the construction with the coating block transfer device described above. On some part of the brush 237a, a guide rail is disposed in the direction of movement of the brush 237a, so that the brush 237a is transferred along the guide rail.

To transfer the brush 237a, a transfer device is needed. Therefore, in the present invention, as a preferred embodiment, a female screw part (not shown) is formed at the brush 237a, the female screw part is engaged with a transfer screw 238c. The transfer screw 238c is rotated by the motor 238d, the brush 237a performs the straight reciprocating motion, and thereby, the solder balls 60 received in the solder ball tray 236 are flatted.

Because it occurs frequently that the solder balls 60 are not attached on the solder ball adsorption block 234 if the interval between the solder ball 60 and the solder ball adsorption block 234 to which vacuum pressure is applied is made very irregularly, the solder ball 60 received in the solder ball tray 236 is flatted by the brush transfer unit 237b or the vibration unit 238a.

As the solder ball 60, which is transferred to the solder ball pad 50 of the base tape 10 by the solder ball transfer unit 230 to seat the solder ball 60 on the solder ball pad 50 of the base tape 10 fixed on the composite unit 210, is very small in the diameter, the solder ball 60 is also very small in the mass and thereby frequently attached not in the solder ball storing hole but on other part of the solder ball adsorption block 234 of the solder ball feeding unit 230 by static electricity.

When the solder ball adsorption block 234 having the solder ball 60, which is attached not in the solder ball storing hole but on other part of the solder ball adsorption block 234, is transferred to the base tape 10 and the solder ball is seated on the solder ball pad 50 of the base tape 10, the solder ball attached not in the solder ball storing hole but on other part of the solder ball adsorption block 234 is seated not on the solder ball pad 50 but on other part.

If the solder ball reflow step is performed in the above state, there occurs a bad solder ball attachment.

Such bad solder ball attachment is very difficult in reproduction into a good product by a repair step. Therefore, in consideration that the solder ball attaching step is the final step in manufacturing the ball grid array package, it must be prevented that the solder ball 60 is attached not in the solder ball storing hole but on other part of the solder ball adsorption block 234 and thereby the bad solder ball attachment occurs.

To embody it, the solder ball cleaning unit 205 is mounted between the composite unit 210 and the solder ball feeding tray unit 239.

The solder ball cleaning unit 205 includes a cleaning block 205a and a cleaning bar 205b mounted on the upper surface of the cleaning block 205a to remove the solder balls 60, which cause the bad solder ball attachment, by scratching the lower surface of the solder ball adsorption unit 235.

Meanwhile, the visual inspection unit 208 is mounted on the upper surface of the base body 800, which is the position between the solder ball cleaning unit 205 and the composite unit 210.

The visual inspection unit 208 is to inspect whether or not the solder balls 60 are normally adsorbed in all solder ball storing holes formed at the solder ball adsorption block 234. The visual inspection unit 208 includes a visual inspection unit case 208a formed on the upper surface of the base body 800, a high-resolution inspection camera 208b mounted inside the visual inspection unit case 208a to capture the lower surface of the solder ball adsorption block 234 and a transfer device (not shown) allowing the inspection camera 208b to reciprocate straight inside the visual inspection unit case 208a.

As the area of the base frame 30 is larger than the area to be captured at a fixed position by the inspection camera 208b in case that the transfer device is attached to the inspection camera 208b, the solder ball feeding unit 230 temporarily stops on the upper surface of the visual inspection unit 208 and inspects whether or not all the solder balls 60 are stored in the solder ball storing hole by the transfer device and the inspection camera 208b. After that, only the solder ball adsorption block 234, on which all the solder balls 60 are normally stored in the solder ball storing hole, is transferred to the composite unit 210 and the solder ball is seated on the upper surface of the solder ball pad 50, which is coated with the flux 55 as it is fixed on the composite unit 210.

Figure 7:
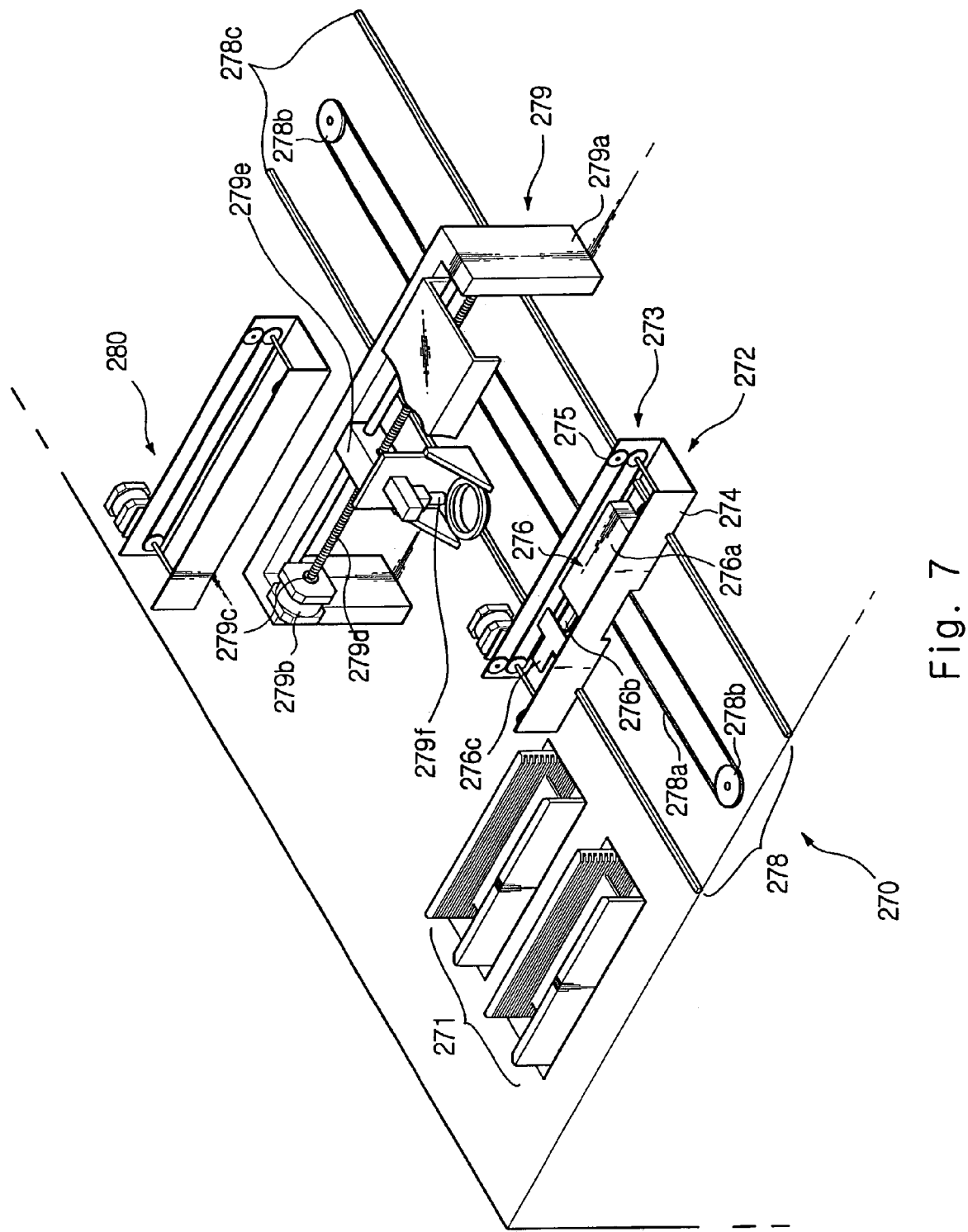
FIG. 7 is a perspective view of the remaining components of the solder ball attaching device of the solder ball attaching system according to the present invention.

As the above, the solder ball pad 50 is coated with the flux 55 on the composite unit 210 and the base frame 30 coated with the flux 55 on which the solder balls 60 are seated is transferred to the sorter unit 270 by the transfer unit 211 of the composite unit 210 as shown in FIG. 7.

The sorter unit 270 includes a number of containers 271, a sorter 272 and a visual inspection unit 279.

The sorter 272 includes a first base frame transfer unit 273 and a second base frame transfer unit 278.

The first base frame transfer unit 273 includes a support body 274 for supporting the base frame 30, a roller transfer unit 275 for pushing the base frame 30 forward of the support body 274 and a base frame pusher 276.

Here, as the support body 274 and the roller transfer unit 275 have the same construction and shape as the support body 212 and the roller transfer unit 213 of the composite unit 210 described previously, the description of them will be omitted. The base frame pusher 276, which is not included in the composite unit 210, will be described in more detail.

The base frame pusher 276 is mounted at the inner bottom surface of the support body 274 and includes an up-down cylinder (not shown), a pusher body 276a, a horizontal displacement cylinder 276b and a pusher plate 276c.

The cylinder rod of the up-down cylinder generates the displacement upward from the bottom surface of the support body 274 and the pusher body 276a is mounted at an end of the up-down cylinder.

The horizontal displacement cylinder 276b is mounted in front of the pusher body 276a and the pusher plate 276c is mounted on the cylinder rod of the horizontal displacement cylinder 276b.

When the base frame 30 is received into a number of containers 271 mounted in front of the support body 274 by the roller transfer unit 275, the pusher plate 276c is useful for completely inserting the base frame 30, which is not completely inserted into the container 271, into the container 271.

Concretely, the cylinder rod of the up-down cylinder of the base frame pusher 276 pushes up the pusher body 276a and the cylinder rod of the horizontal displacement cylinder 276b pushes the pusher plate 276c forward, so that the base frame 30 is completely inserted into the container 271.

At this time, the base frame 30 inserted into the container 271 provided in front of the sorter 272 is the base frame, in which the solder balls 60 are not exactly seated in the designated position of the solder ball pad 50 by the solder ball feeding unit 230 in the composite unit 210, namely, the base frame having a bad seating of the solder ball.

After the above step, as for the base frame having the bad seating of the solder ball, not the reflow step but the solder ball seating step is performed again.

When the solder ball 60 is seated on the solder ball pad 50 by the solder ball seating unit 230 to prevent the occurrence of the bad solder ball attachment in the reflow step, the visual inspection unit 279 determining the bad seating of the solder ball is very useful.

The visual inspection unit 279 is mounted at the position moved parallel from the first base frame transfer unit 273.

In more detail, the visual inspection unit 279 includes a support frame 279a, which is manufactured to be higher than the highest portion of the first base frame transfer unit 273, a motor 279b mounted at a side of the support frame 279a, a transfer screw 279d mounted on a rotary shaft 279c of the motor 279b, a transfer block 279e screwed to the transfer screw 279d and a high-resolution inspection camera 279f mounted at the transfer block 279e.

At this time, the high-resolution inspection camera 279f inspects very accurately whether or not the solder ball 60 is exactly seated on the solder ball pad 50 while reciprocating on the upper portion of the base frame 30 seated on the first base frame transfer unit 273.

To inspect whether or not the solder ball 60 is exactly seated on the solder ball pad 50 using the visual inspection unit 279 separated in a prescribed interval from the first base frame transfer unit 273, to transfer the base frame 30, which has the bad solder ball attachment, into the container 271 described previously, and to transfer the base frame, which does not have the bad solder ball attachment, to the process waiting unit 280 to be described later, the second base frame transfer unit 278 is mounted at the lower surface of the first base frame transfer unit 273. The second base frame transfer unit 278 makes the first base frame transfer unit 273 perform the straight reciprocating motion between the container 271 and the process waiting unit 280.

The second base frame transfer unit 278 includes a projection (not shown) projected at a prescribed position of the lower surface of the first base frame transfer unit 273, a tension belt 278a for power transmission, which is fixed to the projection, has the length extending from the container 271 to the process waiting unit 280 and is laid parallel, a pulley 278b connected at both ends of the tension belt 278a to maintain strain to the tension belt 278a and a pair of guide rails 278c connected to the lower surface of the first base frame transfer unit 273 to transfer the first base frame transfer unit 273 along the designated course.

After the base frame 30 having the bad seating of the solder ball occurred by the sorter 272 and the visual inspection unit 279 is inserted into the container 271, the cleaning step of the solder ball 60 and the flux 55 is performed. After that, the solder ball seating step is started again and the base frame 30, which is not bad in the solder ball seating, is transferred to the process waiting unit 280 as a preparation for performing the reflow step.

As shown in FIG. 7, the process waiting unit 280 is mounted on the position to receive the base frame 30 by the first base frame transfer unit 273 in the state that the sorter 272 is transferred to the end of the guide rails 278c.

In the present invention, preferably, the process waiting unit 280 has the same construction as the transfer unit 211 of the composite unit 210.

The process waiting unit 280 provides the advantage that two base frames 30 are simultaneously reflowed in the reflow device 300, which will be described later in more detail.

That is, after the base frame 30, in which the bad solder ball attachment does not occur, is inserted into the process waiting unit 280, another base frame 30, in which the bad solder ball attachment does not occur, is transferred to be located parallel with the process waiting unit 280 by the first base frame transfer unit 273 and the reflow device 300 picks up the base frame 30 loaded on the first base frame transfer unit 273 and the base frame 30 being standing by at the process waiting unit 280 together to make the base frames 30 be reflowed in the reflow device 300 at the same time.

In the present invention, two base frames 30 are simultaneously reflowed using one process waiting unit 280 and one first base frame transfer unit 273.

Differently, if the process waiting units 280 shown in FIG. 6 are arranged in at least two or more lines, the reflow step is performed in connection with at least three or more base frames 30.

Hereinafter, referring to FIGS. 8 to 11, the construction of the reflow device 300 performing the reflow step will be described in more detail.

Figure 8:
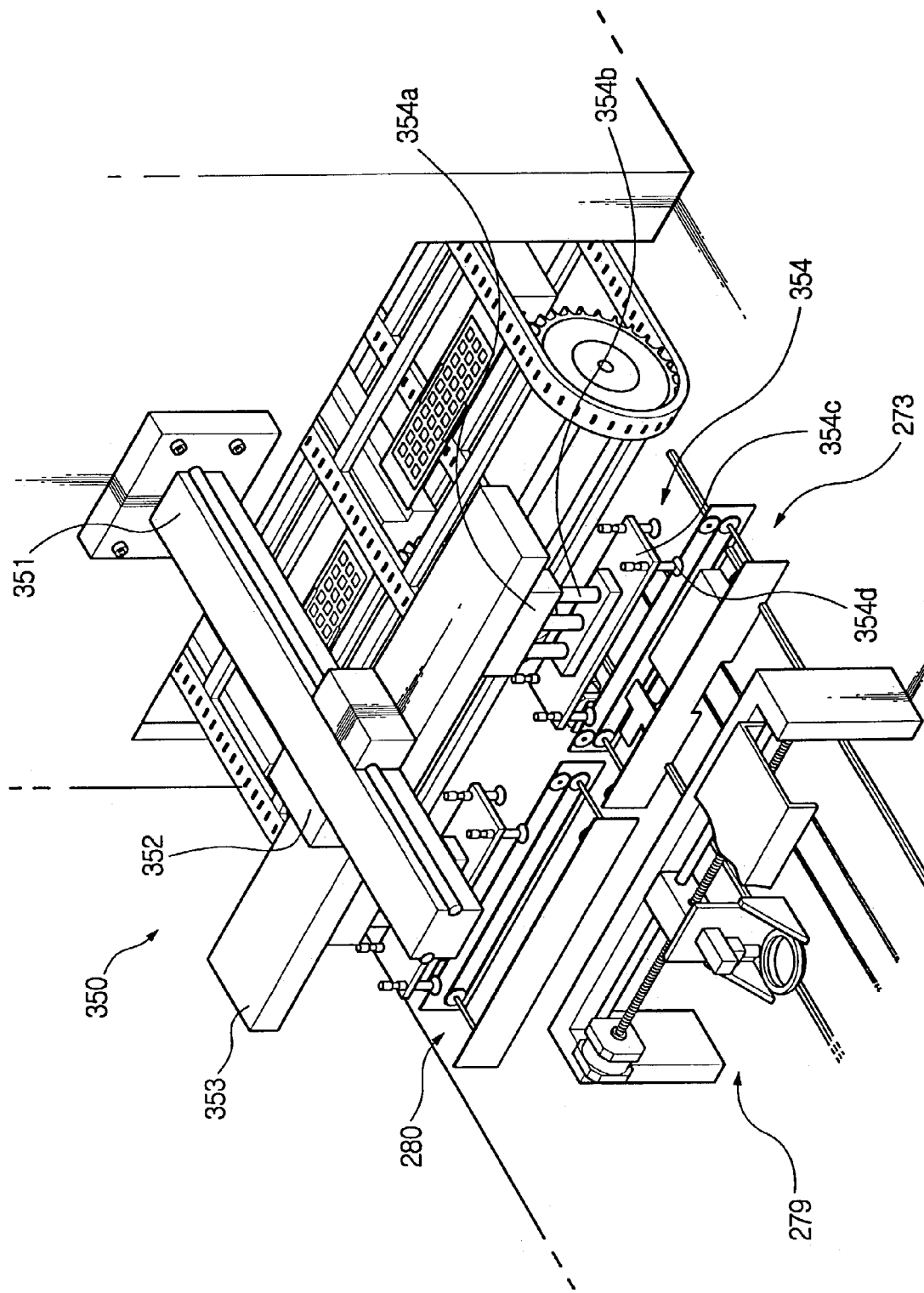
FIG. 8 is a partial perspective view of a reflow device of the solder ball attaching system.
Figure 9:
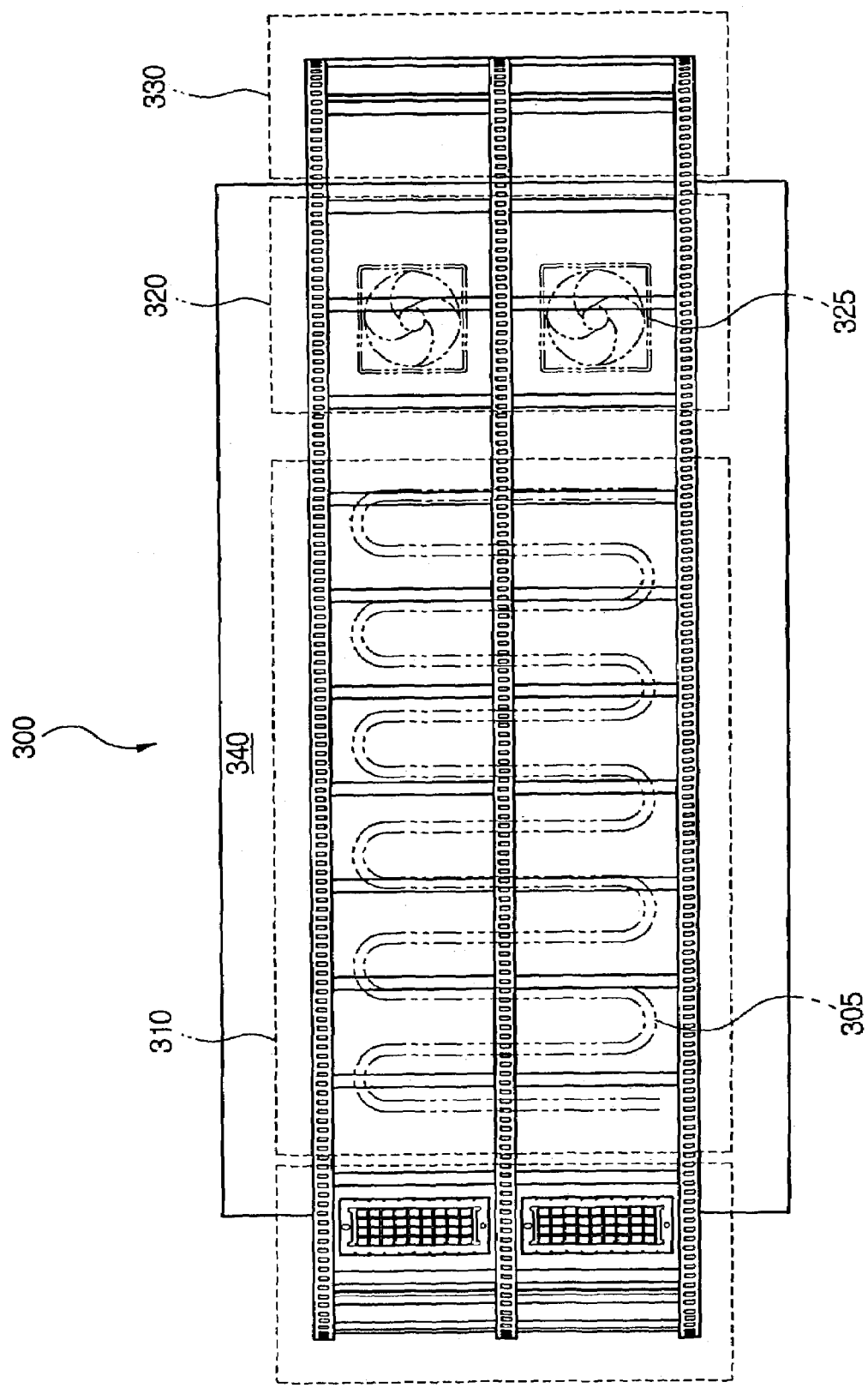
FIG. 9 is a block diagram showing the inside of the reflow device of the solder ball attaching system.

Referring to FIG. 9, the reflow device 300 generally includes: a heating area 310 for heating the solder ball 60 over a melting temperature using heating device 305; a forced cooling area 320 for forcibly cooling the melted solder ball 60 using a cooling fan 325; a reflow furnace 340 having a step transfer device for transferring a natural cooling area 330 and the base frame 30; and a base frame feeder 350 (shown in FIG. 8) for transferring the process waiting unit 280 of the solder ball seating device 200 and the base frame 30 provided from the first base frame transfer unit 273 to the reflow furnace 340.

First, referring to FIG. 8, the base frame feeder 350 will be described as follows.

The base frame feeder 350 includes: a support rod 351 disposed on upper surfaces of the first base frame transfer unit 273 and process waiting unit 280 and disposed on a side wall of the reflow furnace 340; a guider 352 mounted on the support rod 351 and moving along the support rod 351; a pick-up module plate 353 mounted at the guider 352 and located on the upper portions of the first base frame transfer device 273 and the process waiting unit 280; and a pick-up module 354 mounted at the pick-up module plate 353.

The pick-up module 354 includes: an up-down cylinder 354a disposed on the lower surface of the pick-up module plate 353, i.e., oppositely to the base frame 30 seated on the upper surface of the first base frame transfer device 273 and the process waiting unit 280; a pick-up plate 354c disposed at an end of the cylinder rod 354b of the up-down cylinder 354a; and a vacuum pressure generator (not shown) for generating vacuum pressure to collets 354d disposed on the lower surface of the pick-up plate 354c.

The pick-up module 354 picks up the first base frame transfer device 273 and the base frame 30 standing by on the process waiting unit 280 and inserts them into the reflow furnace 340.

Figure 10:
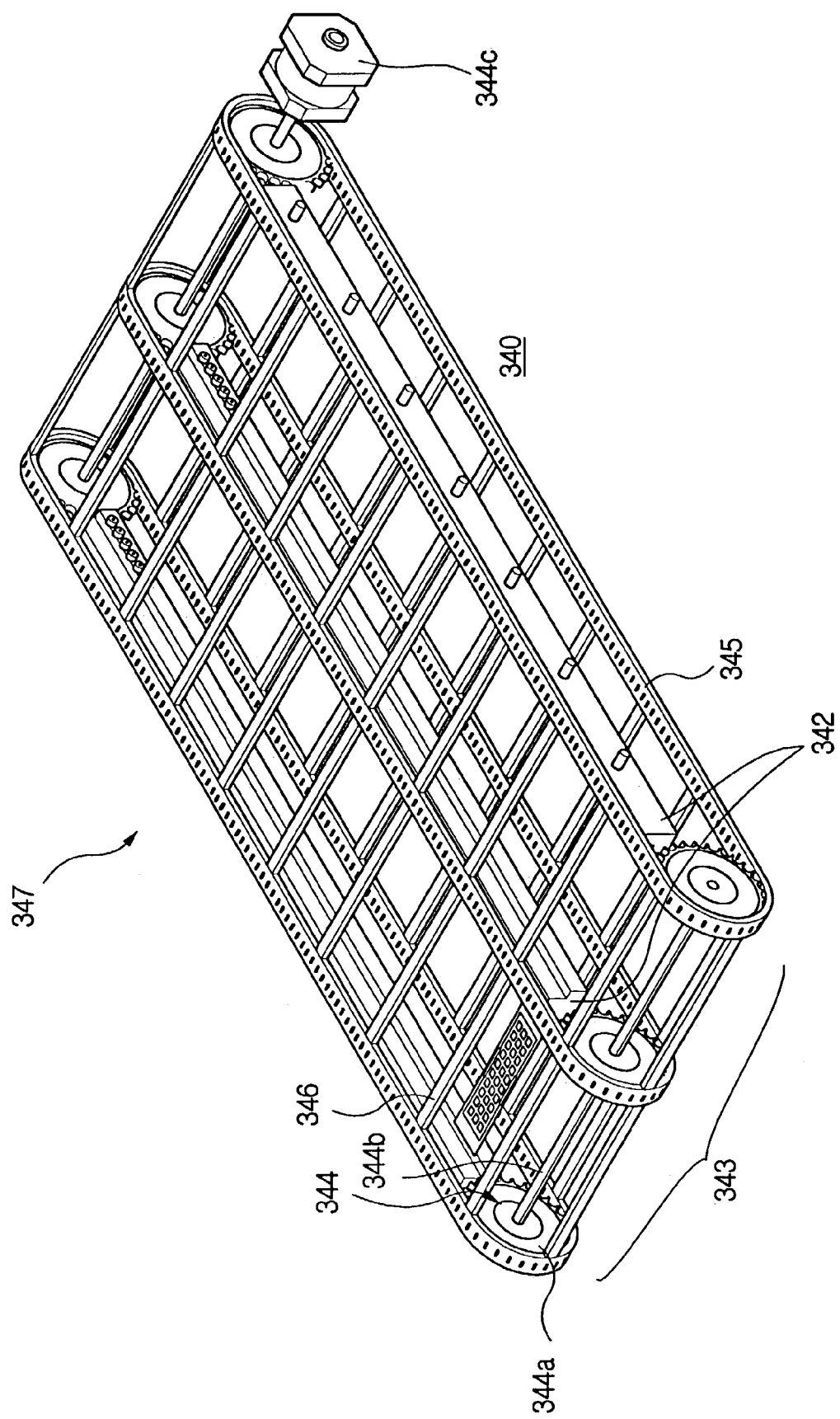
FIG. 10 is a perspective view of a step transfer device of the reflow device of the solder ball attaching system.
Figure 11:
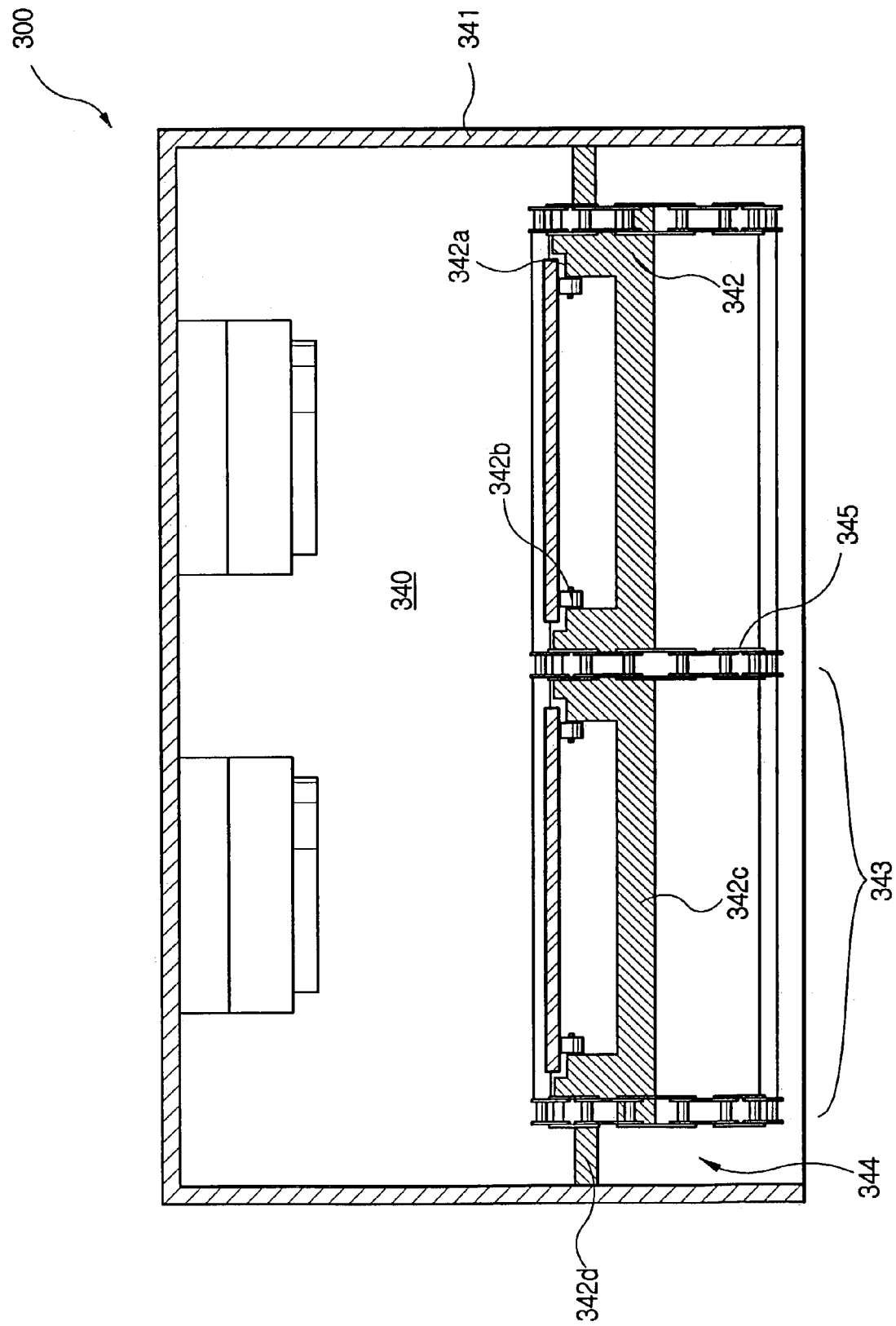
FIG. 11 is a sectional view, cut in the horizontal direction, of the reflow device of the solder ball attaching system.

Referring to FIGS. 9 to 11, the reflow furnace 340 will be described in more detail as follows. The reflow furnace 340 includes a reflow chamber 341, a step transfer device 347 disposed inside the reflow chamber 341, a heating device 305 and a cooling fan 325.

The reflow chamber 341, which is in the form of a long rectangular parallelepiped, is opened at prescribed portions of both ends of the longitudinal direction thereof. The base frame feeder 350 is mounted on a non-opened portion of the partially opened portion. The step transfer device 347 is mounted on the inside bottom of the reflow chamber 341.

Referring to FIG. 10, the step transfer device 347 will be described in more detail as follows.

The step transfer device 347 includes a base frame guide rail 342 having the width to allow the base frame 30 to be seated and a base frame transfer device 343 for pushing out the base frame 30 from an inlet to an outlet of the reflow chamber 341.

In more detail, the reflow device 300 performs the reflow step while two base frames 30 are transferred. Two base frame guide rails 342 are required to support one base frame 30, therefore, four base frame guide rails 342 are mounted.

The base frame guide rails 342 extend from the inlet to the outlet of the reflow chamber 341 and two base frame guide rails 342 form a pair to transfer one base frame 30.

At this time, to transfer the base frame 30 smooth, as shown in FIG. 10, each of the base frame guide rails 342 has a stepped portion 342a at a portion contacted with the base frame 30 to prevent the base frame 30 from being transferred irregularly.

Additionally, each of the base frame guide rails 342 may have a number of rollers 342b mounted to be in contact with the base frame 30. The rollers 342 are transferred very smooth in minimized shake or vibration to the base frame 30.

All of the base frame guide rails 342 are connected to the adjacent base frame guide rails 342 by the connection bars 342 and two outermost base frame guide rails 342 are fixed and supported on the side wall of the reflow chamber 341.

When the base frame 30 is seated on the base frame guide rails 342 by the base frame feeder 350, the seated base frame 30 is passed inside the reflow chamber 341 by the step transfer device 347.

To embody it, the reflow chamber 341 requires a base frame transfer device 343 inside in relation with the base frame guide rails 342.

The base frame transfer device 343 may be embodied in various structures, for example, a transferring body consisting of a cylinder and a cylinder rod and a transferring bar mounted on the cylinder rod for transferring the base frame along the base frame guide rails 342, however there is a difficulty in embodying the consecutive motion of the cylinder. Therefore, in the present invention, as the most preferred embodiment, that the base frames 30 are consecutively transferred by a sprocket wheel, a transfer chain and a transfer bar will be described.

Concretely, the base frame transfer device 343 includes two sprocket wheel assemblies 344, transfer chains 345 and transfer bars 346.

Concretely, the sprocket wheel assembly 344 includes: three sprocket wheels 344a generally arranged in rows in regular intervals; sprocket wheel shafts 344b connecting the sprocket wheels 344a; and a motor 344c connected to the sprocket wheel shaft 344b. Two sprocket wheel assemblies 344 are used at both ends of the base frame guide rail 342.

In the present invention, a shaft of the motor 344c and the sprocket wheel assembly 344 connected to the sprocket wheel shaft 344b are defined as a driving sprocket wheel assembly and the remaining is defined as a slave sprocket wheel assembly.

At this time, the distance between the outermost sprocket wheels of three sprocket wheels constituting the driving sprocket wheel assembly and the slave sprocket wheel assembly is somewhat farther than that between the outermost base frame guide rails of four base frame guide rails 342. The remaining sprocket wheel is located between two central base frame guide rails of four base frame guide rails 342.

Furthermore, the sprocket wheel shafts 344b of the driving sprocket wheel assembly and of the slave sprocket wheel assembly is disposed and supported on the side wall of the reflow chamber 341 like the base frame guide rail 342.

The transfer chains 345 are connected the sprocket wheels 344a of the driving sprocket wheel assembly and the slave sprocket wheel assembly respectively.

Meanwhile, the driving sprocket wheel assembly and the transfer chain 345 are in a rotatable state by the driving of the motor 344c of which the shaft is connected to the driving sprocket wheel assembly and the plural transfer bars 346 are connected between the adjacent transfer chains 345.

At this time, the number of the transfer chains 346 and the turning speed of the sprocket wheel assembly 344 are very important and are set within the range of a sufficient period of time and a sufficient cooling period of time for melting and attaching the solder ball 60 seated on the base frame 30.

Meanwhile, to melt and attach the solder balls 60 seated on the solder ball pads 50 of the base frame 30, which is transferred from the inlet to the outlet of the reflow chamber 341 by the step transfer device 347, the reflow chamber 341 has the heating area 310, the forced cooling area 320 and the natural cooling area 330 inside, briefly described above.

Concretely, the heating area 310, to secure sufficient temperature and period of time for melting and attaching the solder balls 60 on the solder ball pads 50, is formed in a relatively wide space inside the reflow chamber 341. The forced cooling area 320 is formed at a position adjacent to the heating area 310 to cool the heated base frame 30 of a high temperature to a prescribed temperature. The natural cooling area 330 is formed at a position adjacent to the forced cooling area 320.

At this time, the heating device 305, which is capable of accurately controlling temperature and generating sufficient heat for melting the solder ball 60, is mounted in the heating area 310 and the cooling fan 325 is mounted in the forced cooling area 320.

Meanwhile, it is preferable that a base frame stopper (not shown) is mounted in the natural cooling area 330 to restrict the movement of the base frame 30, which is terminated till the natural cooling, until the base frame 30 is transferred for the next step.

As the flux 55, which serves as a support for completely attaching the melted solder ball 60 on the solder ball pad 50, remains on the solder ball pad 50 after the solder ball 60 is attached on the solder ball pad 50 of the base frame 30, at which the reflow step of the reflow device 300 is finished, the flux 55 remaining on the base frame 30 must be removed.

To embody it, the base body 800 adjacent to the reflow device 300 has a cleaning device 400 mounted to remove the water-soluble flux 55.

At this time, as one embodiment for minimizing the area of the solder ball attaching system 801 according to the present invention, the cleaning device 400 is arranged along the side of the reflow device 300 and thereby the base frame 30 passing the reflow device 300 passes the cleaning device 400 oppositely to the direction that the base frame 30 passed the reflow device 300.

Through the arrangement of the cleaning device 400, the solder ball attaching system 801 occupies the smallest area. However, to embody it, a transfer device for transferring the base frame 30 from the outlet of the reflow device 300 to the inlet of the cleaning device 400 is additionally required.

Figure 12:
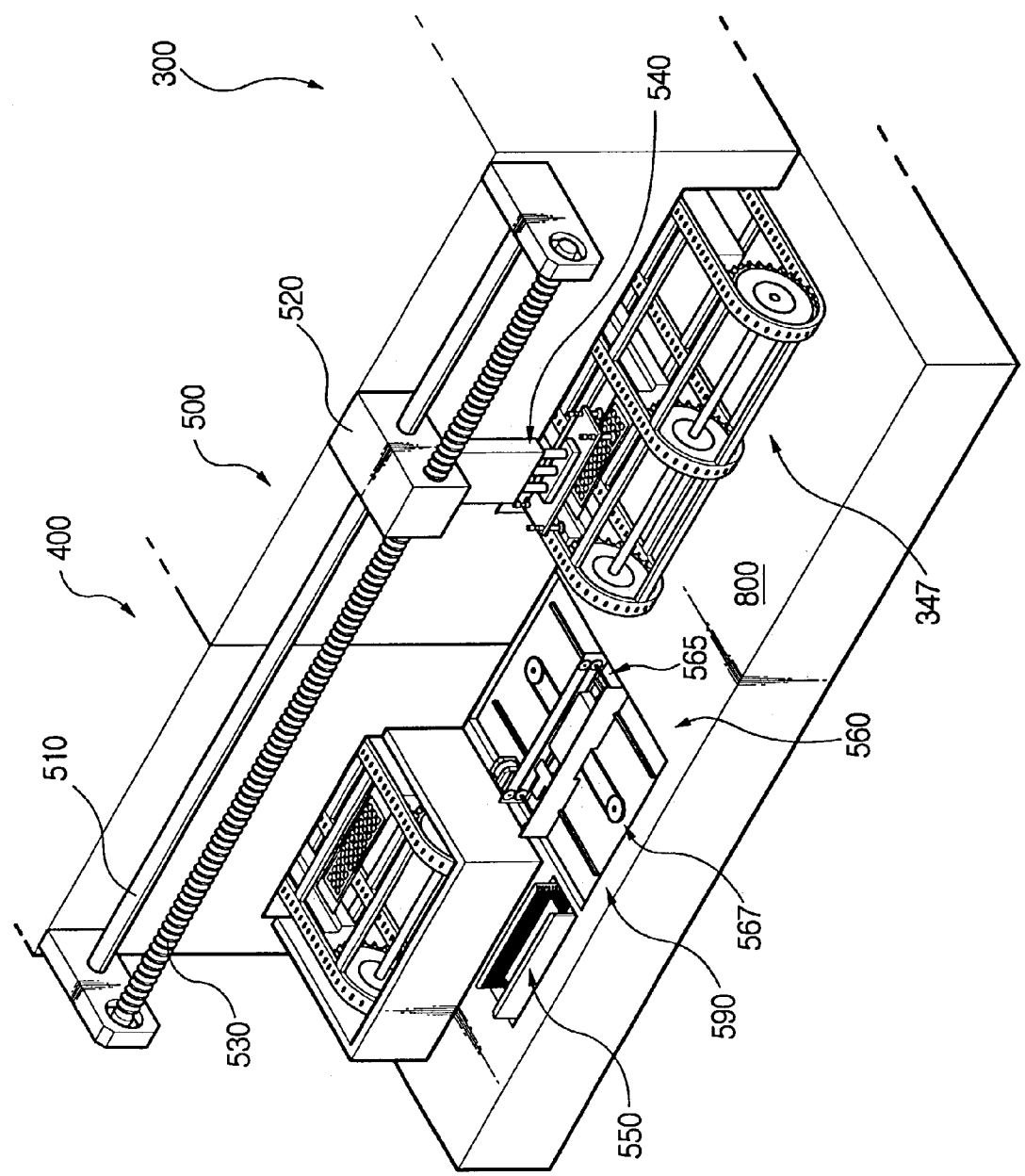
FIG. 12 is a perspective view showing the rear of the reflow device, a transfer device and a cleaning device.

FIG. 12 shows a preferred embodiment of the transfer device 500 according to the present invention.

The transfer device 500 includes: a guide rail 510 extending from a side wall of the reflow chamber 341 of the reflow device 300 to a side wall of a cleaning chamber of the cleaning device 400 to transfer the base frame 30 from the outlet of the reflow device 300 to the inlet of the cleaning device 400, which will be described later in detail; a guide block 520 moving along the guide rail 510; a transfer screw 530 screwed to the guide block 520 and a pick-up module 540 mounted at an end of the transfer screw 530.

The pick-up module has the same construction as the pick-up module 354 of the base frame feeder 350 mounted in the reflow device 300, and therefore, the repetition thereof in the description will be omitted.

Meanwhile, to consecutively perform the steps prior to the cleaning step, i.e., the solder ball attaching step and the reflow step even though the cleaning device 400 is out of order, a base frame temporarily storing device 590 is mounted on the base body 800, on which the transfer device 500 is mounted.

Concretely, the base frame temporarily storing device 590 includes at least one or more containers 550 and base frame transfer units 560 like the sorter unit 270 of the solder ball seating device 200 previously described.

The base frame transfer unit 560, which has the same construction as the sorter unit 270, includes first and second base frame transfer units 565 and 567. As the first and second base frame transfer unit 565 and 567 are equal in the construction with the first and second base frame transfer units 273 and 279 of the sorter unit 270, the description of them will be omitted.

Figure 13:
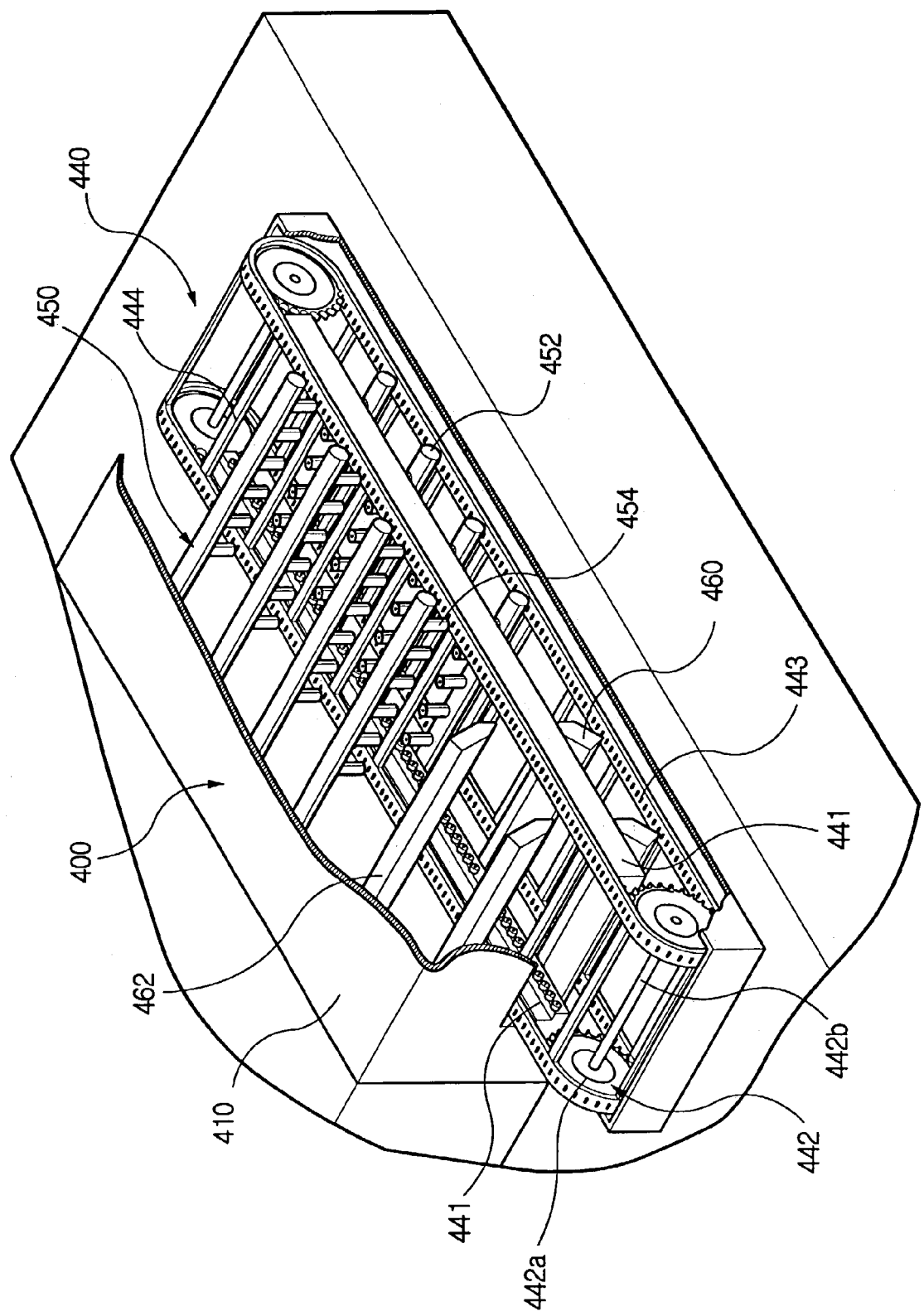
FIG. 13 is a perspective view, taken in partial section, of the cleaning device.

Hereinafter, the cleaning device 400 for cleaning the base frame 30 discharged from the reflow device 300 will be described referring to FIG. 13.

Figure 14:
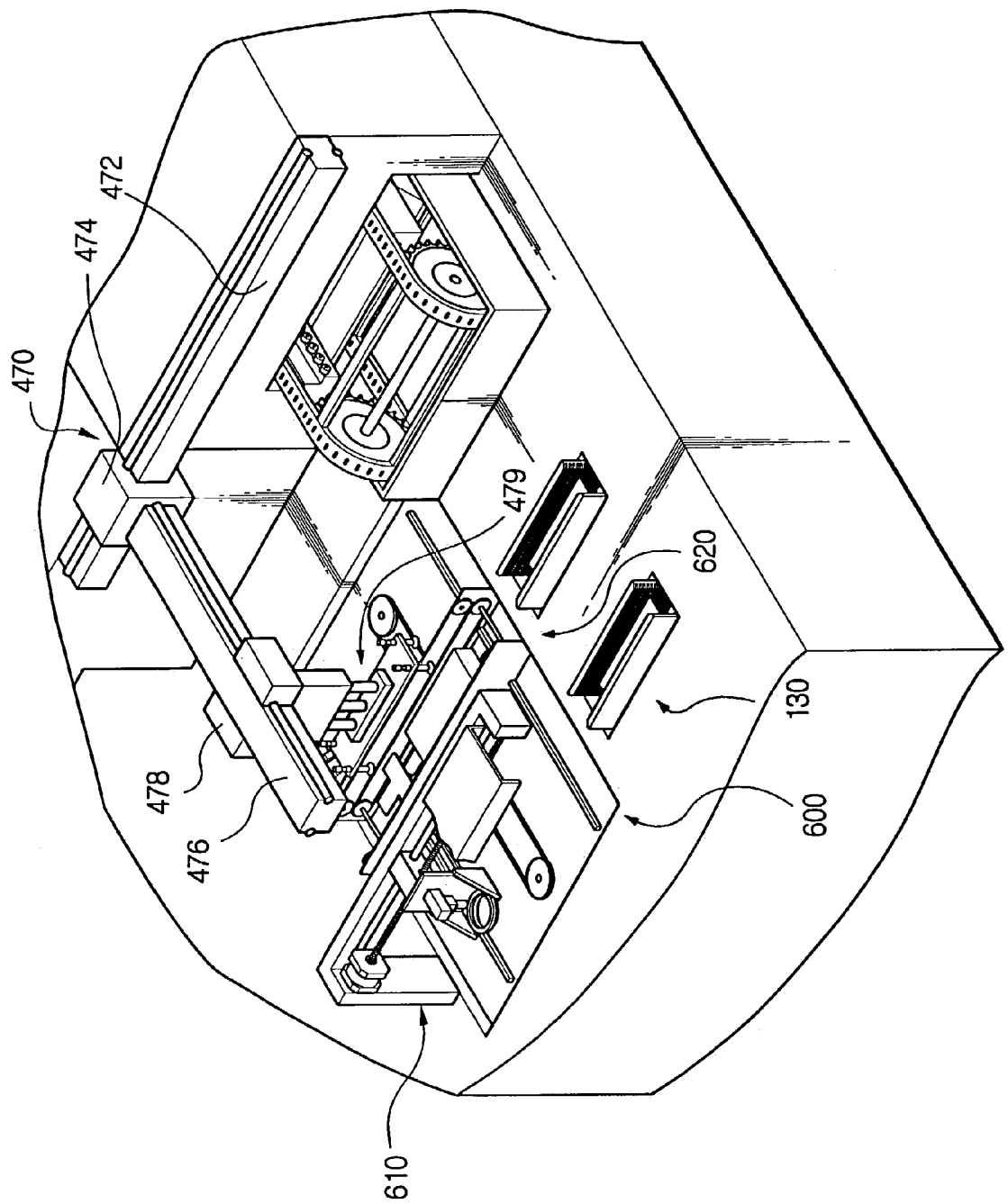
FIG. 14 is a perspective view of a base frame loader device of the solder ball attaching system.
Figure 15A:
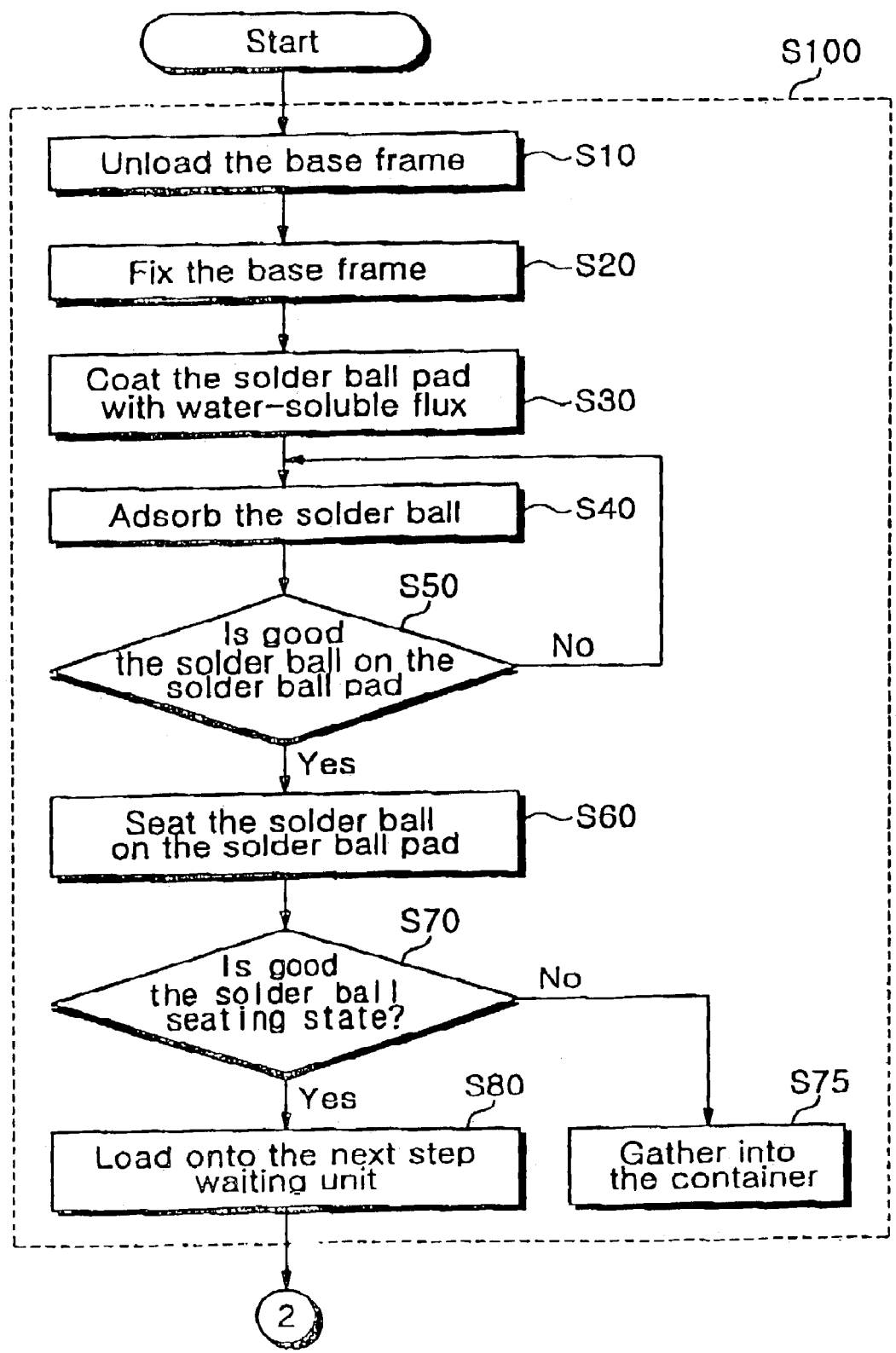
FIGS. 15a and 15b are flow charts of a process of the solder ball attaching system according to the present invention.
Figure 15B:
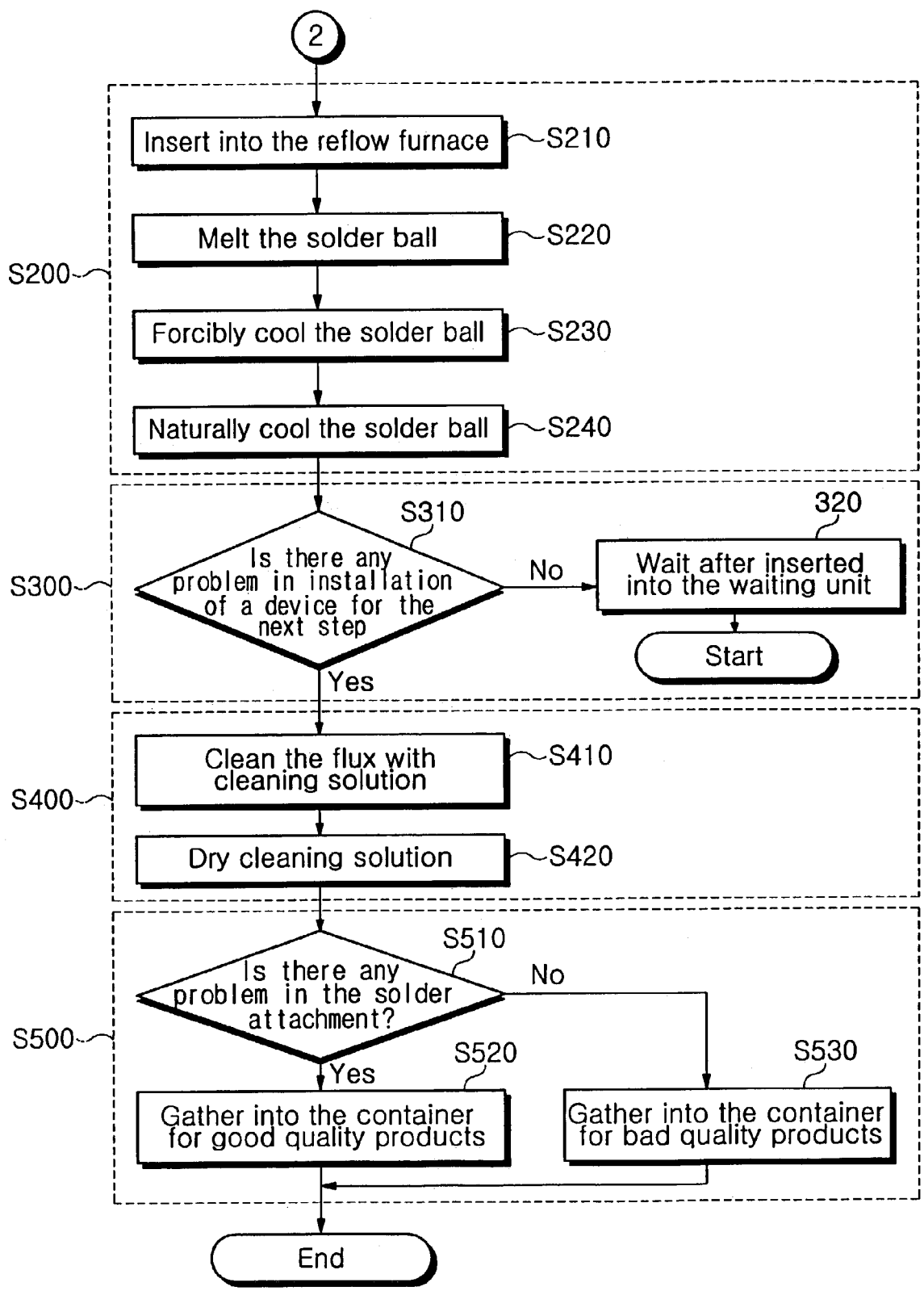

The cleaning device 400 generally includes a cleaning chamber 410, a transfer device 440, a cleaning solution injecting device 450, a drier device 460 and an unloader 470 for the cleaning device shown in FIG. 14.

The cleaning chamber 410, as previously described, is in the form of a rectangular parallelepiped closely disposed on the side of the reflow chamber 341. The cleaning chamber 410 has an inlet and an outlet formed at both ends. Some of the cleaning chamber 410 is made of a transparent material to allow the observation of the cleaning step of the base frame 30 from the outside.

Meanwhile, the transfer device 440 for transferring the base frame 30 is mounted inside the cleaning chamber 410 and the drier device 460 for drying the cleaning solution injecting device 450 and the cleaning solution is mounted at the upper and lower portions of the transfer device 440 to clean the water-soluble flux 55 remaining on the solder ball pad 50 of the base frame 30.

The transfer device 440 includes two base frame guide rails 441 and a sprocket wheel assembly 442.

Two base frame guide rails 441, which are in the form of a bar, are separated from each other to seat the base frames 30 on the upper surface thereof and fixed at the inside side surface of the cleaning chamber 410.

Transfer rollers (not shown) are mounted at portions of the base frame guide rail 441, which is fixed on the side surface of the cleaning chamber 410, in contact with the lower surface of the base frame 30 in regular intervals to transfer the base frame 30 smooth.

The sprocket wheel assembly 442 includes sprocket wheels 442a, rotary shafts 442b, transfer chains 443 and transfer bars 444.

The transfer chains 443 are disposed parallel with the base frame guide rails 441 from the outside of the base frame guide rails 441. The sprocket wheels 442a are connected to both ends of the transfer chains 443 and the sprocket wheels 442a, which are arranged oppositely, are fixed by the rotary shafts 442b respectively. At this time, one of the rotary shafts 442b is connected with a motor shaft of a motor (not shown).

Two transfer chains 443, which are arranged oppositely to each other at the outside of the base frame guide rails 441, are connected by the transfer bars 444.

At this time, the transfer bars 444 push out the base frame 30, put on the base frame guide rails 441, from the inlet to the outlet of the cleaning device 400 while the transfer chains 443 are rotated by the sprocket wheels 442a.

The cleaning solution injecting device 450 and the drier device 460 are mounted on the upper and lower portions of the transfer device 440 in the cleaning chamber 410.

The cleaning solution injecting devices 450 are arranged in rows along the inside of the cleaning chamber 410 from the inlet to the outlet of the cleaning chamber 410. The cleaning solution injecting device 450 includes cleaning solution injecting pipes 452, cleaning solution feeders (not shown) and a plurality of cleaning solution injecting nozzle 454.

The cleaning solution injecting pipes 452 are mounted and supported on a side wall of the cleaning chamber 410. The cleaning solution feeder for feeding the cleaning solution is communicated with an end of the cleaning solution injecting pipes 452 and the plural cleaning solution injecting nozzles 454 are arranged at the cleaning solution injecting pipes 452 in regular intervals.

To dry the base frames 30 cleaned by the cleaning solution in the cleaning solution feeders, The final drier device 460 is mounted between the portion, on which the cleaning solution injecting device 450 is mounted, and the outlet of the cleaning chamber 410.

The drier device 460 injects the dried air onto both sides of the base frame 30 wetted by the cleaning solution while cleaned by the cleaning solution injecting device 450 to dry the base frame 30.

To embody it, air knifes 462 are arranged at the upper and lower portions of the transfer device 440. The air knife 462 has a high-temperature and dried air feeding device (not shown) is mounted to supply high-temperature and dried air.

As previously described, the solder balls 60 are melted and seated on the solder ball pads 50 of the base frame 30 while passing the transfer device 440, the cleaning solution injecting device 450 and the drier device 460. At this time, the flux 55 remaining on the solder ball pads 50 is removed and the cleaned base frame 30 is transferred to the outlet of the cleaning chamber 410 by the transfer device 440.

The unloader 470 for discharging the base frame 30 to the outside of the cleaning chamber 410 is mounted at the outlet of the cleaning chamber 410.

Referring to FIG. 14, the unloader 470 includes a first guide rail 472 protruded in a prescribed length from the side wall of the outlet of the cleaning chamber 410 toward the reflow device 300, a first transfer block 474 mounted on the first guide rail 472 to move along the first guide rail 472, a second guide rail 476 mounted at the first transfer block 474 to be at right angles to the first guide rail 472, a second transfer block 478 mounted on the second guide rail 476 to move along the second guide rail 476 and a pick-up module 479 mounted at the second transfer block 478 to move vertically and to adsorb the base frame 30 by vacuum pressure.

The base frame 30 picked up from the cleaning device 400 through the unloader 470 of the cleaning device 400 is transferred to the base frame loader device 600 including the visual inspection unit 610 for finally inspecting whether or not the solder ball 60 formed on the solder ball pad 50 of the base frame 30 is exactly attached, the base frame sorter 620 and at least two or more containers 130 in which the base frames 30 are divided and inserted by the base frame sorter 620.

At this time, the visual inspection unit 610, the base frame sorter 620 and the containers 130 have the same construction as the visual inspection unit 279, the sorter unit 270 and the containers 271 disposed on the solder ball seating device 200, and therefore, their description will be omitted.

At this time, the base frame loader device 600 is mounted between the unloader 470 and the base frame unloading device 100 described above.

Like this, when the base frame loader device 600 is mounted near the base frame unloader device 100, the container 130 used for the base frame unloader device 100 is transferred to the base frame loader device 600 by the guide rails (not shown) and the transfer device (not shown), which are mounted inside the base body 800. The base frames 30, which are determined as a good quality product by the visual inspection unit 610, are inserted into the transferred container 130.

Hereinafter, referring to the attached flow chart, the working of the solder ball attaching system 801 will be described as follows.

First, one of the containers 130 in which the base frame 30 to be inserted into the base body 800 is loaded on the upper portion of the base body 800 by the container elevator 110 of the base frame unloader device 100. After that, the uppermost base frame 30 of the base frames 30 inserted into the container 130 is unloaded from the container guider 120 by the container guider 120 and the pusher 140 (Step 10).

The unloaded base frame 30 is temporarily and firmly fixed by the base frame adsorption pad 215 and the alignment keys 215a formed on the composite unit 210 located in front of the container guider 120 (Step 20).

In the state that the base frame 30 is fixed to the composite unit 210, the solder ball pads 50 of the base frame 30 are coated with the flux 55 by the flux coating unit 220 (Step 30).

The step for coating the solder ball pad 50 with the flux using the flux coating unit 220 will be described in more detail. The coating unit of the flux coating unit 220 forms thin flux film on the bottom of the flux tray 228a while reciprocating the flux tray 228a. When the flux coating block 224 of the flux coating unit 220 is moved downward, the flux is covered on the flux coating block 224. The flux covered on the flux coating block 224 is coated on the solder ball pad 50 by the transfer of the flux coating unit 220.

After that, the solder ball 60 is adsorbed on the solder ball pad 50 by the solder ball feeding unit 230 (Step 40) and it is inspected by the visual inspection unit 208 that the solder ball 60 is exactly adsorbed in the solder ball storing hole of the solder ball feeding unit 230 (Step 50).

At this time, the step for adsorbing the solder ball 60 on the solder ball feeding unit 230 will be described in more detail. First, the solder ball feeding unit 230 is transferred to the solder ball tray 236, in which the plural solder balls 60 are inserted. After that, in the state that vacuum pressure is formed in the solder ball storing hole of the solder ball feeding unit 230, the solder ball feeding unit 230 is contacted with the solder ball 60 inserted in the solder ball tray 236, and thereby the solder ball 60 is inserted into the solder ball storing hole of the solder ball feeding unit 230 by the vacuum pressure formed in the solder ball storing hole.

After that, when the solder ball feeding unit 230 returns in its original position, the solder ball tray 236 is flatted by the vibration unit 238a and the brush unit 238 and is standing by for the next step.

If there is any one of the solder ball storing holes of the solder ball feeding unit 230, in which the solder ball 60 is not seated, the solder ball feeding unit 230 is moved to the solder ball tray 236 and tries to seat the solder ball 60 in all the solder ball storing holes.

As the result of the inspection by the visual inspection unit 208, if the solder balls 60 are seated in all the solder ball storing holes and the preparation for seating of the solder balls is finished, the solder balls 60 inserted into the solder ball feeding unit 230 are seated on the upper surface of the solder ball pads 50, and at the same time, on the upper surface of the flux 55 having the viscosity (Step 60).

After that, the composite unit 210 transfers the base frames 30 to the sorter 272 of the sorter unit 270 and the sorter 272 transfers them to the visual inspection unit 279. The visual inspection unit 279 inspects whether or not the solder balls 60 are exactly attached on the upper surface of the solder ball pad 50. If it is determined by the inspection of the visual inspection unit 279 that the solder ball pad 50 is not exactly located in the designated position, the corresponding base frame 30 is inserted into the container 271, in which bad base frames 30 are inserted (Step 75), the base frames 30 having the solder balls 30 of a good seating state are transferred to the process waiting unit 280, in which the base frames 30 are temporarily standing by for the reflow step (Step 80).

After that, the steps from 10 to 80 are performed again. The base frame 30, on which the solder ball 60 is exactly attached on the upper surface of the solder ball pad 50, is coincided with the process waiting unit 280 by the sorter unit 270 and standing by till the next step, and thereby the solder ball attaching step is finished (Step 100).

When the solder ball attaching step is finished, the base frames 30 standing by in the process waiting unit 280 and the sorter unit 270 enter into the reflow step.

First, the waiting base frame 30 is picked up by the base frame feeder 350, and after seated on the step transfer device 347 mounted inside the reflow chamber 341, inserted into the reflow chamber 341 by the step transfer device 347 (Step 210).

After that, the base frame 30 is transferred inside the reflow chamber 341 by the step transfer device 347. The solder ball 60 seated on the solder ball pad 50 of the base frame 30 is melted by heat transmitted by the heating device mounted inside the reflow chamber 341 and attached on the solder ball pad 50 (Step 220).

While the solder ball 60 is melted on the solder ball pad 50, the step transfer device 347 is continuously transferred inside the reflow chamber 341. In the result, the base frame 30 having the melted solder ball 60 is transferred to the compulsory cooling area 320 where a cooling fan is disposed, and then, is forcibly cooled by wind ventilated from the cooling fan (Step 230).

Subsequently, through the movement of the step transfer device 347, after cooled in temperature lower than the melting point of the solder ball 60 by the cooling fan, the base frame 30 is transferred to the natural cooling area 330 to be cooled nearly to the room temperature (Step 240). The reflow step 200 is finished.

After that, the base frame 30 cooled nearly to the room temperature is transferred to the cleaning device 400 by the transfer device 500. The central processing system determines whether or not the cleaning device 400 is normally working before transferring the base frame 30 from the reflow device 300 tot he cleaning device 400 (Step 310). If the cleaning device 400 does not operate normally, the base frames 30, which finished the reflow step, are temporarily inserted into the container 450 (Step 320). The transfer step is finished.

After that, the central processing system repeats the steps from 10 to 310 until the cleaning device 400 works normally.

If the central processing system determines that the cleaning device 400 works normally, the reflow device 300 seats the base frame 30 on the transfer device 440 of the cleaning device 400 by the transfer device 500 and operates the base frame 30 to pass the base frame 30 through the cleaning solution injecting device 450. The cleaning solution injecting device 450 removes the flux 55 remaining on the solder ball pad 50 while injecting the cleaning solution (Step 410).

After that, the transfer device 440 is worked again and the base frame 30 passes the drier device 460. At this time, the cleaning solution covered on the base frame 30 is dried by the high-temperature and dried air injected from the drier device 460 (Step 420). The cleaning step 400 is finished.

After that, the base frame 30 is discharged outside through the outlet of the cleaning chamber 410 and picked up by the pick-up module 479 of the unloader 470. After the base frame 30 is transferred to the base frame sorter 620 of the base frame loader device 600, the base frame 30 seated on the base frame sorter 620 is finally inspected whether or not the solder ball attaching process is normal (Step 510). The normal base frames 30 are transferred into the container, which stores the good quality products, by the base frame sorter 620, and stored in the base frame receiving container, which stores the good quality products. The base frames 30, which are determined as bad quality, are transferred to the base frame storing container, which stores the bad quality products, by the base frame sorter 620 and stored in the base frame storing container. If the unit process that solder balls 60 are attached n the solder ball pad 50 of the base frame 30 is finished, the base frame loading step 500 is finished.

According to the above description, the plural devices required to attach the solder ball on the solder ball pad formed on the base tape attached on the base frame are installed integrally in one equipment, thereby the area, where the solder ball attaching equipment occupies, is minimized.

Furthermore, as the plural devices required for solder ball attachment are installed in one equipment, the solder ball attaching process can be performed consecutively without a stop to increase the efficiency of the equipment.

Moreover, the arrangement that the plural devices are installed in one equipment allows the automatization of the whole solder ball attaching process as the required devices are in the relation of the preceding step and the following step in all the devices.

Additionally, the arrangement that the plural devices are installed in one equipment allows the minimization of the distance of movement between the devices, and thereby there is no bad solder ball attachment during the transfer of the base frame.

Furthermore, the arrangement that the plural devices are installed in one equipment allows the control of the devices by one control device, and thereby the devices required for the solder ball attachment can be controlled very efficiently.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A method for attaching solder balls of a ball grid array package, the method comprising:

a solder ball seating step of unloading base frames attaching base tapes on which solder ball pads are provided, coating the solder ball pads with flux, transferring identified solder balls on positions of the corresponding solder ball pads respectively, transferring the base frame after confirming the position of the solder balls on the solder ball pads, and transferring an empty container, from which all base frames are unloaded, in a designated position;

a solder ball reflow step of melting and cooling the solder balls seated on the solder ball pads and transferring the base frames after receiving the base frames from the solder ball seating step;

a cleaning step of removing the flux covered on the solder ball pads and transferring the base frames after receiving the base frames from the solder ball reflow step; and a base frame storing step of determining quality of the base frames received from the cleaning step, sorting the base frames according to the quality and storing the base frames in the empty container transferred to the designated position;

wherein the base frames, which finished the solder ball seating step, are transferred in the first direction, the empty container is transferred to the designated position along the second direction, the base frames, which finished the solder ball reflow step, are transferred in the third direction, and the base frames, which finished the cleaning step, are transferred in the fourth direction toward the empty container transferred to the designated position.

2. The method as claimed in claim 1, wherein the first, second, third and fourth directions are directed in such a manner that the transfer course of the base frames is in the form of a loop.

* * * * *